United States Patent
Okita et al.

(10) Patent No.: US 11,817,323 B2
(45) Date of Patent: Nov. 14, 2023

(54) ETCHING METHOD AND ELEMENT CHIP MANUFACTURING METHOD

(71) Applicant: Panasonic Intellectual Property Management Co., Ltd., Osaka (JP)

(72) Inventors: Shogo Okita, Hyogo (JP); Atsushi Harikai, Osaka (JP); Akihiro Itou, Kyoto (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 232 days.

(21) Appl. No.: 17/188,005

(22) Filed: Mar. 1, 2021

(65) Prior Publication Data

US 2021/0287913 A1    Sep. 16, 2021

(30) Foreign Application Priority Data

Mar. 10, 2020  (JP) .................. 2020-041311

(51) Int. Cl.
| | |
|---|---|
| *H01L 21/311* | (2006.01) |
| *H01L 21/78* | (2006.01) |
| *H01L 21/683* | (2006.01) |
| *H01L 21/3065* | (2006.01) |
| *H01L 21/02* | (2006.01) |

(52) U.S. Cl.
CPC .... *H01L 21/31138* (2013.01); *H01L 21/6836* (2013.01); *H01L 21/78* (2013.01); *H01L 21/02274* (2013.01); *H01L 21/30655* (2013.01); *H01L 2221/68327* (2013.01)

(58) Field of Classification Search
CPC ............... H01L 21/306; H01L 21/3065; H01L 21/30655; H01L 21/6835; H01L 21/6836; H01L 2224/26–33519; H01L 2224/32221–3226; H01L 2224/2901–29019; H01L 2224/2902–29036; H01L 2224/291–29184;

(Continued)

(56) References Cited

U.S. PATENT DOCUMENTS

2019/0221479 A1*  7/2019  Okita .................. H01L 21/78

FOREIGN PATENT DOCUMENTS

JP        2017-114945 A      6/2017

* cited by examiner

*Primary Examiner* — Julio J Maldonado
*Assistant Examiner* — Stanetta D Isaac
(74) *Attorney, Agent, or Firm* — PEARNE & GORDON LLP

(57) ABSTRACT

An etching method including: a preparation step of preparing a resin layer and an electronic component supported thereby; and a resin etching step of etching the resin layer. The electronic component has a first surface covered with a protective film, a second surface opposite thereto, and a sidewall therebetween. The second surface is facing the resin layer. The resin layer is larger than the electronic component when seen from the first surface side. The resin etching step includes: a deposition step of depositing a first film, using a first plasma, on a surface of the protective film and a surface of the resin layer; and a removal step of removing, using a second plasma, the first film deposited on the resin layer and at least part of the resin layer. The deposition and removal steps are alternately repeated, with the protective film allowed to continue to exist.

12 Claims, 27 Drawing Sheets

(58) Field of Classification Search
CPC .............. H01L 2224/2919–29191; H01L 2224/8385–83885; H01L 2224/8388
See application file for complete search history.

ETCHING METHOD AND ELEMENT CHIP MANUFACTURING METHOD

CROSS REFERENCE TO RELATED APPLICATION

The present application is based on and claims priority under 35 U.S.C. § 119 with respect to the Japanese Patent Application No. 2020-041311 filed on Mar. 10, 2020, of which entire content is incorporated herein by reference into the present application.

TECHNICAL FIELD

The present invention relates to an etching method and an element chip manufacturing method.

BACKGROUND

When producing from a single substrate a plurality of element chips to be multilayered, such as flash memories, in some cases, the substrate is attached with a die attach film, and in this state, dicing is applied, as disclosed in Patent Document 1 (JP 2017-114945). The die attach film (DAF) is formed of, for example, a resin composition including a resin and an inorganic filler.

In dicing a substrate attached with a DAF, typically, the substrate is diced (or half-cut) first by a physical way, such as mechanical dicing or stealth dicing, and then the DAF is severed by another way, such as cool expanding or laser ablation.

As miniaturization and thinning of packages proceed, there have been increasing needs for thinner substrates. In the devices like flash memories, with advancement of the multi-layering technique, the thickness of substrates has been reduced to as small as about 30 μm, which is expected to be further reduced to as small as about 10 μm.

In the cool expanding, a substrate attached with a dicing tape (holding tape) and a DAF is half-cut, and then, the holding tape is expanded. When half-cut to a predetermined depth, the substrate is separated into a plurality of element chips. When expanded, the DAF attached to the substrate is severed. However, with reduction in thickness of the substrate, its physical strength is also reduced. Therefore, an expanding force strong enough to sever the DAF is difficult to apply with less damage to the substrate. Moreover, with increased versatility in function, the crystal orientation of the silicon used as a material of substrates has been diversified, and the doped ion concentration in the silicon has been increasing. Therefore, the substrate is difficult to be separated in a consistent direction, and the severing direction of the DAF also tends to be unstable.

In the laser ablation, since the DAF has adhesiveness, burrs are likely to occur. Therefore, the end surface of the element chip and the end surface of the severed DAF tend to fail to be flush with each other. Also, the severed DAFs may be rejoined through the burrs. Moreover, the laser irradiation is targeted between the element chips. This necessitates mapping of the positions of the element chips after the substrate is diced, for which the processing time tend to be longer.

SUMMARY

One aspect of the present invention relates to an etching method, the method including: a preparation step of preparing a resin layer and an electronic component supported by the resin layer; and a resin etching step of etching the resin layer, the electronic component having a first surface covered with a protective film, a second surface opposite to the first surface, and a sidewall between the first surface and the second surface, the second surface facing the resin layer, the resin layer being larger than the electronic component when seen from the first surface side, the resin etching step including: a deposition step of depositing a first film, using a first plasma, on a surface of the protective film and a surface of the resin layer; and a removal step of removing, using a second plasma, the first film deposited on the resin layer and at least part of the resin layer, the deposition step and the removal step being alternately repeated a plurality of times, with the protective film allowed to continue to exist.

Another aspect of the present invention relates to an element chip manufacturing method, the method including: a preparation step of preparing a stack, the stack including a substrate having a first surface and a second surface opposite to the first surface, and a resin layer disposed facing the second surface, the substrate having a plurality of element regions and dicing regions defining the element regions; a protective film formation step of covering the first surface with a protective film; an aperture formation step of removing at least the protective film along the dicing regions, to form apertures; a substrate etching step of etching the substrate exposed from the apertures, from the first surface to the second surface; and a resin etching step of etching the resin layer exposed at a bottom of grooves formed by etching of the substrate, after the substrate etching step, the resin etching step including: a deposition step of depositing a first film, using a first plasma, on a surface of the protective film and a surface of the resin layer; and a removal step of removing, using a second plasma, the first film deposited on the resin layer and at least part of the resin layer, the deposition step and the removal step being alternately repeated a plurality of times, with the protective film allowed to continue to exist.

According to the present invention, the resin layer can be removed with less damage to the electronic component.

DETAILED DESCRIPTION

Figure 1:
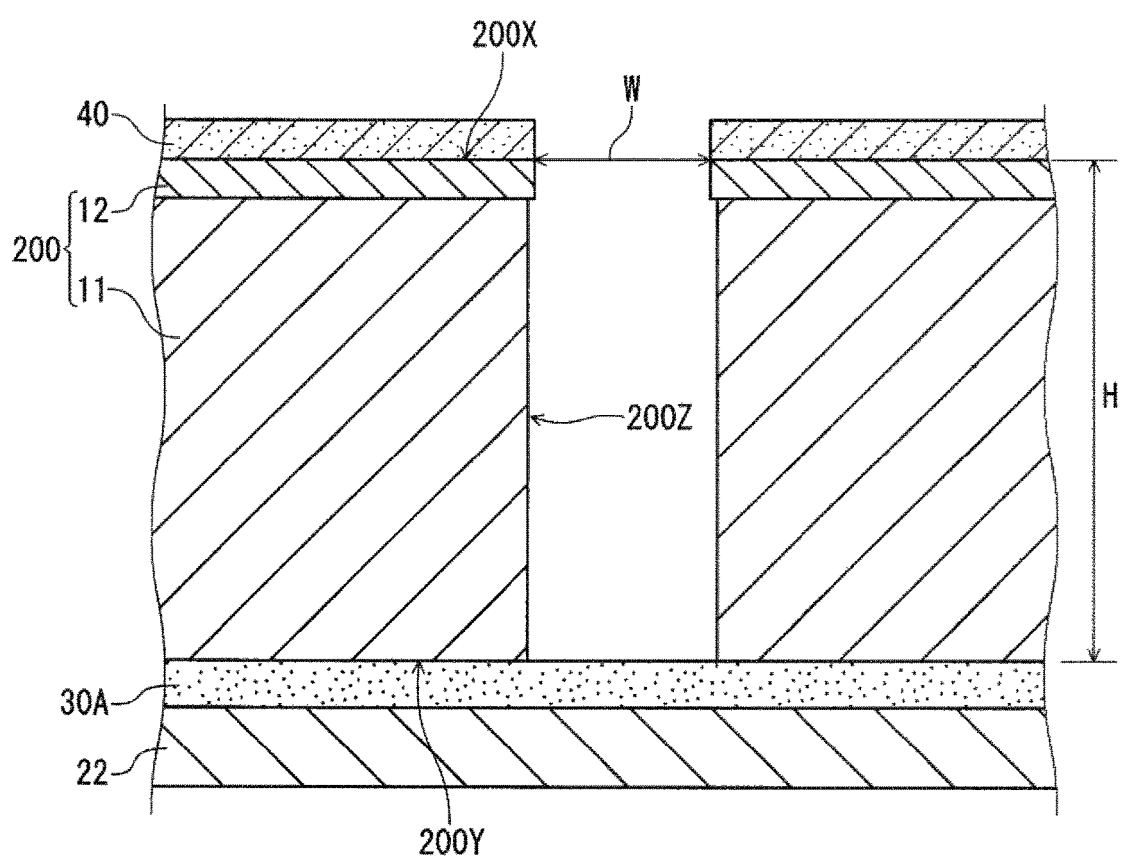
FIG. 1 is a schematic cross-sectional view of an essential part of electronic components subject to a resin etching step according to a first embodiment of the present invention.

Plasma dicing has been attracting attention as a method of dicing a substrate, in which plasma etching is applied to the substrate to dice it into a plurality of chips. During the plasma dicing, usually, the element regions of the substrate are protected with a mask, and only the dicing regions defining the element regions are etched with plasma. The mask is formed by, for example, covering the surface of the substrate with a protective film, and then removing the protective film along the dicing regions. In some cases, the mask is provided beforehand on the surface of the substrate, in order to protect the substrate during production, as well as the electronic components after distribution. The protective film includes a resin film to be provided afterwards on these substrates, and an electrically insulating film (e.g., polyimide, silicon nitride ($Si_3N_4$), silicon oxide film ($SiO_2$)) provided beforehand on the substrate.

In the plasma etching, it is necessary to select a process gas used for generating a plasma, depending on the materials, thickness, and the like of an object to be processed. When the object to be processed includes a substrate and a resin material as mentioned above, different process gases are selected for etching the substrate mainly composed of a semiconductor material and for etching the resin material comprising an organic material.

The mask, that is, the protective film, is provided for protecting the element regions, and is not a target of plasma etching. In other words, in the case of plasma-etching a stack including a substrate and a DAF, it is required to etch the DAF, with the protective film allowed to continue to exist. Without the protective film, the element regions may be damaged. When the protective film is also formed of a resin material, however, it is difficult to selectively plasma etching the DAF only.

One possible way to allow the protective film made of a resin material to continue to exist is to form it thick. A thick protective film, however, is difficult to be formed uniformly. The non-uniform thickness of the protective film degrades the quality of etching, and thus likely to degrade the quality of element chips obtained. Moreover, the thick mask may take a long time to be removed, which may increase the cost.

When the protective film is made of $Si_3N_4$, too, it is difficult to electively plasma-etch the DAF only, with the protective film allowed to continue to exist. This is because $Si_3N_4$ is also etched with a plasma gas for etching the resin material, and a thick film is difficult to form using $Si_3N_4$.

Furthermore, the DAF usually contains a filler. Plasma etching tends to proceed quickly in the vicinity of the filler. During the plasma dicing, when the filler is scattered onto the protective film, plasma etching may proceed locally in the vicinity of the scattered filler, which may cause a pinhole in the protective film.

In the present embodiment, the difference in the ease of plasma processability between a principal surface of electronic component and the resin layer supporting the electronic component is utilized to remove the resin layer. By utilizing this difference, the resin layer can be removed, with the protective film covering the principal surface of the electronic component allowed to continue to exist. In the resin etching step of the present embodiment, a deposition step and a removal step as described below are repeated.

In the deposition step, using a first plasma, a first film is deposited on a surface of the protective film covering one principal surface (first surface) of the electronic component and a surface of the resin layer. The first film deposits thick on the surface of the protective film where the surface is easily exposed to plasma. On the other hand, the first film deposits thinner on the resin layer than on the protective film. The first surface is protected with the protective film and the thick first film.

In the removal step, using a second plasma, the first film deposited on the resin layer is removed together with at least part of the resin layer. As described above, the first film is deposited thinner on the resin layer. Therefore, as the first film is removed in the removal step, the resin layer is also removed. On the other hand, the first film is deposited thick on the first surface. Therefore, the underlying protective film is not etched in the removal step or, if etched, the amount thereof is small. The first film on the surface of the protective film is removed.

By repeating the above deposition and removal steps, the deposition and removal of the first film are repeated on the first surface. In other words, even when the deposition step and the removal step are repeated, the protective film itself is unlikely to be etched. Therefore, damage to the first surface by the resin etching step is very small, if any. On the other hand, on the surface of the resin layer, as the deposition and removal of the first film are repeated, the resin layer itself is also gradually removed. The deposition and removal steps may be repeated any number of times, and can be repeated until the resin layer is removed. This is because the protective film itself is unlikely to be etched as described above.

According to the etching method of the present embodiment, the resin layer can be removed in a simple and easy manner, with the protective film allowed to continue to exist. Therefore, the etching method of the present embodiment is particularly suitable for removing the DAF attached to the electronic component. The etching method of the present embodiment is also particularly suitable for removing the adhesive adhering to the electronic component.

The present embodiment encompasses a method of manufacturing element chips from a stack including a resin layer and a substrate. According to the element chip manufacturing method of the present embodiment, high quality element chips can be provided. The stack may include a resin layer and one or more substrates disposed on one side of the resin layer, or may include a resin layer and one or more substrates disposed on each of both sides of the resin layer (e.g., laminated substrate).

The resin etching step will be described below more specifically.

The resin etching step includes a deposition step and a removal step. In the resin etching step, the deposition step and the removal step are alternately repeated a plurality of times.

(a) Deposition Step

In this process, a first film is deposited on a surface of the protective film and a surface of the resin layer.

The first film is deposited using, for example, a first plasma generated from a first process gas containing carbon atoms (C). With the gas containing carbon atoms, the first film can be deposited efficiently on the protective film and the sidewall surface. Examples of the gas containing carbon atoms include: fluorocarbon gas, such as $C_4F_8$ and $C_5F_8$; and fluorohydrocarbon, such as $CHF_3$ and $CH_2F_2$.

The first process gas may include another gas, such as Ar, $CH_4$, $H_2$, and $N_2$. The proportion of the gas containing carbon atoms in the first process gas may be 10 vol % or more and less than 100 vol %, and may be 30 vol % or more and 98 vol % or less.

The first film may be deposited in any thickness on the surface of the protective film. The thickness of the first film deposited on the surface of the protective film can be set as appropriated depending on the conditions of the removal step, the productivity, and the like. The thickness of the first film deposited on the surface of the protective film may be 3 nm or more and 660 nm or less, and may be 50 nm or more and 300 nm or less. The first film having such a thickness can be formed at a deposition rate of 200 nm/min or more and 2000 nm/min or less for a deposition time of 1 s or more and 20 s or less.

The first film formed on the surface of the resin layer is preferably not excessively thick. A ratio D2/D1 of a thickness D2 of the first film deposited on the surface of the resin layer to a thickness D1 of the first film deposited on the surface of the protective film is preferably 4/10 or less, more preferably 3/10 or less. D2/D1 is preferably 1/100 or more, more preferably 1/50 or more. The thickness D2 is an average of thicknesses measured at any five points of the first film deposited on the surface of the resin layer.

The conditions for generating the first plasma are set as appropriate depending on the thickness, components, and the like of the first film. The first plasma is preferably generated under such conditions that allow the first film to deposit in a sufficient thickness on the surface of the protective film but does not allow it to deposit too thick on the surface of the resin layer. In this case, the resin layer can be removed with a small number of cycles repeated, and thereby, the productivity can be improved.

The rate at which the first film deposits on the surface of the protective film in the deposition step is denoted as RD1, and the rate at which the first film deposits on the surface of the resin layer in the deposition step is denoted as RD2. In view of the above, a ratio RD2/RD1 of the rate RD2 to the rate RD1 is preferably 4/10 or less, preferable to be 3/10 or less. RD2/RD1 is preferably 1/100 or more, more preferably 1/50 or more.

The deposition rate of the first film can be controlled by, for example, adjusting the conditions in a plasma processing apparatus used for the resin etching step, such as the high-frequency power applied to a first electrode disposed facing a stage to be loaded with the electronic component, the high-frequency power applied to a second electrode incorporated in the stage, the flow rate of gas, and the temperature of the electronic component. Applying a high-frequency power to the second electrode generates a bias voltage applied to the stage. Note that in the deposition step, the high-frequency power applied to the second electrode is preferably as low as possible, and may be 0 W. This can slow the deposition rate RD2 of the first film on the surface of the resin layer.

In order to deposit the first film in a sufficient thickness on the surface of the protective film, while avoiding excessive deposition of the first film on the surface of the resin layer, for example, the pressure in a processing chamber may be increased. Increasing the pressure in the chamber while increasing the absolute value of the deposition rate of the first film is particularly effective. In this case, the difference of the amount of the first film deposited per unit time between on the surface of the protective film and on the surface of the resin layer increases, and RD2/RD1 tends to decline.

In order to increase the pressure in the chamber, for example, the gas flow rate may be increased. In order to increase the absolute value of the deposition rate of the first film, for example, the following measures can be taken: increasing the gas flow rate, increasing the high-frequency power applied to the first electrode, and lowering the temperature of the electronic component. The gas flow rate, however, has an upper limit (threshold value) set according to the power value of the high-frequency power applied to the first electrode. Therefore, with the gas flow rate set near this upper limit, by adjusting the gas exhaust rate, the pressure in the chamber and the absolute value of the deposition rate of the first film can be both increased. Two or more of the above measures may be combined. For example, while increasing the gas flow rate, the electronic component may be cooled down, and further, the high-frequency power applied to the first electrode may be increased. In the deposition step, the chamber is preferably set at a pressure of 10 Pa or more. The electronic component can be cooled down by, for example, allowing the electronic component to be adsorbed to the cooled stage.

The conditions for generating the first plasma are, for example, as follows. $C_4F_8$ is supplied as a process gas at 100 sccm or more and 600 sccm or less into the chamber (vacuum chamber). The pressure in the vacuum chamber is 10 Pa or more and 40 Pa or less. A high-frequency power ED1 is 1000 W or more and 4800 W or less, and a high-frequency power ED2 is 0 W or more and 100 W or less. The stage temperature is −15° C. or more and 15° C. or less. According to the above conditions, the deposition can proceed at a rate of about 100 nm/min or more and about 2500 nm/min or less. The processing time can be determined depending on how thick the first film is to be deposited on the surface of the protective film. The processing time is, for example, 1 s or more and 10 s or less.

(b) Removal Step

In this process, at least part of the resin layer is removed with a second plasma. The resin layer is removed together with the first film. At this time, the first film covering the surface of the protective film may also be removed. Note that, however, the first film on the protective film is thick, and the protective film is unlikely to be damaged.

For the removal of the resin layer and/or the first film (hereinafter sometimes collectively referred to as the resin layer etc.), a second plasma is used which is generated from, for example, a second process gas containing oxygen atoms. With the second plasma derived from a gas containing oxygen atoms, the resin layer etc. mainly composed of an organic material can be efficiently removed. Examples of the gas containing oxygen atoms include $O_2$, $CO_2$, CO, and $H_2O$.

The second process gas may include another gas, examples of which include a fluorine-containing gas, and an inert gas, such as Ar. The fluorine-containing gas serves to remove the resin layer etc. efficiently, even when the resin layer contains a filler, such as silica. The inert gas serves to increase the physical sputtering effect by the second plasma. Examples of the fluorine-containing gas include a fluorocarbon gas, such as $CF_4$ or $C_4F_8$, a fluorohydrocarbon gas, such as $CHF_3$, and $SF_6$. The proportion of the gas containing oxygen atoms in the second process gas may be 10 vol % or more and less than 100 vol %, and may be 30 vol % or more and 98 vol % or less.

The conditions for generating the second plasma are set as appropriate depending on the amount, components, and the like of the resin layer etc. Desirably, the second plasma is generated under such conditions that allow the first film on the protective film not to be excessively removed. In this case, the protective film is unlikely to be damaged, and thereby, the first surface can be protected.

The rate at which the first film on the surface of the protective film is removed in the removal step is denoted as RR1, and the rate at which the first film on the surface of the resin layer is removed in the removal step is denoted as RR2. In view of the above, a ratio RR2/RR1 of the rate RR2 to the rate RR1 is preferably 3/10 or more and 10/10 or less.

The removal rate of the first film on the surface of the resin layer can be controlled by, for example, adjusting the high-frequency power applied to the first electrode, the high-frequency power applied to the second electrode, the pressure in the chamber, and/or the flow rate of gas.

In order to effectively remove the first film on the surface of the resin layer, for example, the pressure in the chamber may be decreased, and/or the high-frequency power applied to the second high-frequency electrode may be increased. Decreasing the pressure in the chamber while increasing the absolute value of the removal rate of the first film is particularly effective. In order to increase the absolute value of the removal rate of the first film, for example, the high-frequency power applied to the first high-frequency electrode may be increased. These measures may be used in combination. Specifically, for example, while decreasing the pressure in the chamber, the high-frequency power applied to the second electrode may be increased, and further, the high-frequency power applied to the first electrode may be increased.

In the removal step, the chamber is preferably set at a pressure of 15 Pa or less, and a high-frequency power of preferably 0.42 W/cm$^2$ or more (equivalent to 300 W or more when the diameter of the second electrode is 300 mm) is applied to the second electrode per unit area.

The conditions for generating the second plasma are, for example, as follows. A mixed gas of $O_2$, $CO_2$ and $SF_6$ (ratio of flow rate of $O_2/CO_2/SF_6$=175/175/50) is supplied as a process gas at 50 sccm or more and 600 sccm or less into the vacuum chamber. The pressure in the vacuum chamber is 1 Pa or more and 15 Pa or less. A high-frequency power ER1 is 1000 W or more and 4000 W or less, and a high-frequency power ER2 is 100 W or more and 1000 W or less. The stage temperature is −15° C. or more and 15° C. or less. According to the above conditions, the removal of the first film can proceed at a rate of about 200 nm/min or more and about 3000 nm/min or less. The removal of the resin layer can proceed at a rate of about 3300 nm/min when the die attach film contains no filler, about 3200 nm/min when the die attach film has a filler content of 10%, and about 1500 nm/min when the die attach film has a filler content of 30%. The processing time may be any length of time in which the first film having deposited on the surface of the protective film in the deposition step can be removed. The processing time is, for example, 1 s or more and 200 s or less, and preferably 4 s or more and 200 s or less.

The deposition step and the removal step are alternately repeated a plurality of times. Each time the removal step is performed, the amount of the resin layer decreases. On the other hand, the thickness of the protective film is maintained. The deposition step may be repeated under the same or different conditions. For example, the processing time in the deposition step may be gradually shortened. Likewise, the removal step may be repeated under the same or different conditions. For example, the processing time in the removal step may be gradually prolonged. Alternatively, in the removal step, the high-frequency power ER2 applied to the second electrode may be increased with time. The resin etching step may begin with the deposition step or the removal step. The resin etching step, however, preferably ends with the removal step.

The resin etching step is performed, as described above, by utilizing the difference in the ease of processability between the principal surface of the electronic component and the resin layer. The resin etching step is preferably performed such that the ratio RD2/RD1 of the rate RD2 to the rate RD1 in the deposition step and the ratio RR2/RR1 of the rate RR2 to the rate RR1 in the removal step satisfies RR2/RR1>RD2/RD1. In other words, the resin etching step is preferably performed under such conditions that, in comparison with the first film on the surface of the protective film, the first film is difficult to be deposited on the resin layer, and the resin layer and the first film thereon are easy to be removed. In this case, the resin layer can be removed more efficiently.

In order to satisfy the relationship RR2/RR1>RD2/RD1, for example, the chamber may be set at a pressure PD1 during the deposition step and at a pressure PR1 during the removal step, so as to satisfy PD1>PR1.

Also, for example, the second electrode may be applied with a high-frequency power ED2 during the deposition step and a high-frequency power ER2 during the removal step, so as to satisfy ED2<ER2.

In the resin etching step, a plurality of the electronic components may be processed simultaneously. This can improve the productivity. In this case, a distance W between the sidewalls facing each other of any two adjacent electronic components and a height H of the sidewall of one of the two of the electronic components may satisfy H≥2 W. Even with such high-aspect-ratio gaps, according to the present embodiment, the resin layer can be removed, with the protective film allowed to continue to exist on the principal surfaces of the electronic components. The height H and the distance W may satisfy H≤50 W.

The height H of the sidewall is not limited. The height H of the sidewall is, for example, 20 μm or more. The distance W between the sidewalls also is not limited. The distance W between the sidewalls is, for example, 4 μm or more and 60 μm or less.

The distance W is an average of the shortest distances at any two points between the first-surface-side ends of the sidewalls facing each other of any two adjacent electronic components, and averaging the measured shortest distances. When the sidewalls do not entirely face each other, the shortest distance is measured at the portions where the sidewalls face each other. The height H of the sidewall is the lower of two averages each determined by measuring a height at any two points of each of the two sidewalls (or the portions thereof) used for determining the distance W. The height of the sidewall corresponds to a shortest distance between the first and second surfaces connected via the sidewall.

First Embodiment

In the present embodiment, the resin layer includes a die attach film (DAF). The electronic components are supported by being attached to the DAF.
(DAF)

The DAF has adhesiveness and functions as both a dicing tape and a bonding material. For example, in the case of producing a plurality of element chips to be multi-layered, such as flash memories, a substrate is attached to the DAF and, in this state, is diced.

The DAF is formed of, for example, a resin composition including a resin and an inorganic filler.

Examples of the resin include phenol resins having photosensitivity, such as phenol/formaldehyde novolac resin, cresol/formaldehyde novolac resin, xylenol/formaldehyde novolac resin, resorcinol/formaldehyde novolac resin, and phenol-naphthol/formaldehyde novolac resin.

Examples of the inorganic filler include aluminum hydroxide, magnesium hydroxide, calcium carbonate, magnesium carbonate, calcium silicate, magnesium silicate, calcium oxide, magnesium oxide, aluminum oxide, aluminum nitride, and silica.

The DAF may have any thickness. For ease of handling, the thickness of the DAF may be 5 μm or more and 100 μm or less, and may be 5 μm or more and 20 μm or less.

The first embodiment will be specifically described below with reference to the drawings, in which the electronic component is illustrated as having a semiconductor layer and a wiring layer. The electronic component according to the present embodiment, however, is not limited thereto.

FIG. 1 is a schematic cross-sectional view of an essential part of the electronic components subject to the resin etching step. A plurality of electronic components 200 are supported by a DAF 30A and a holding sheet 22. The holding sheet 22 is used for improving the ease of handling, and may not be necessarily used. The holding sheet 22 will be specifically described later.

The electronic components 200 each include a semiconductor layer 11 and a wiring layer 12 disposed on the semiconductor layer 11 on a first surface 200X side. The first surface 200X is covered with a protective film 40. A second surface 200Y is attached to the DAF (resin layer) 30A.

Figure 2:
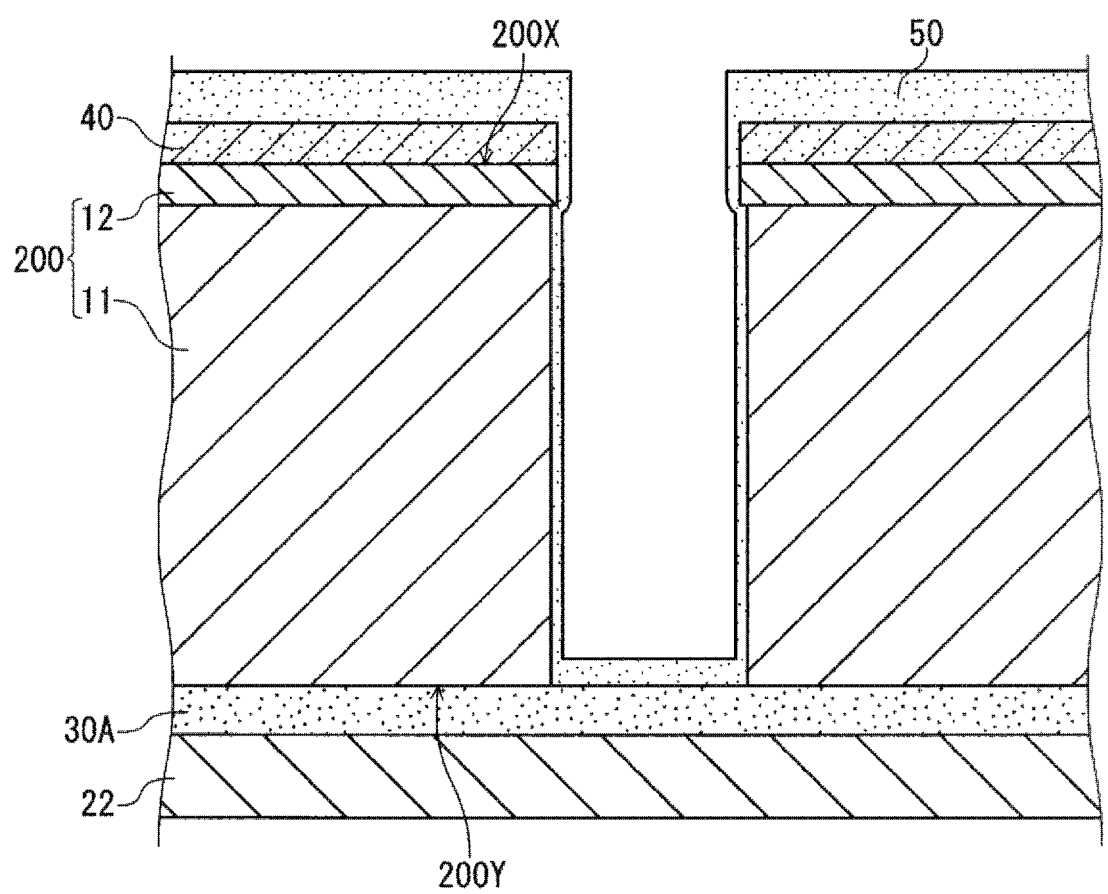
FIG. 2 is a schematic cross-sectional view of an essential part of the electronic components after a deposition step at the 1st time according to the first embodiment of the present invention.

FIG. 2 is a schematic cross-sectional view of an essential part of the electronic components after the deposition step at the 1st time. A first film 50 is deposited on the surface of the protective film 40 and the surface of the DAF 30A exposed from between the adjacent electronic components 200. Note that the first film 50 on the DAF 30A is thinner than that on the protective film 40.

Figure 3:
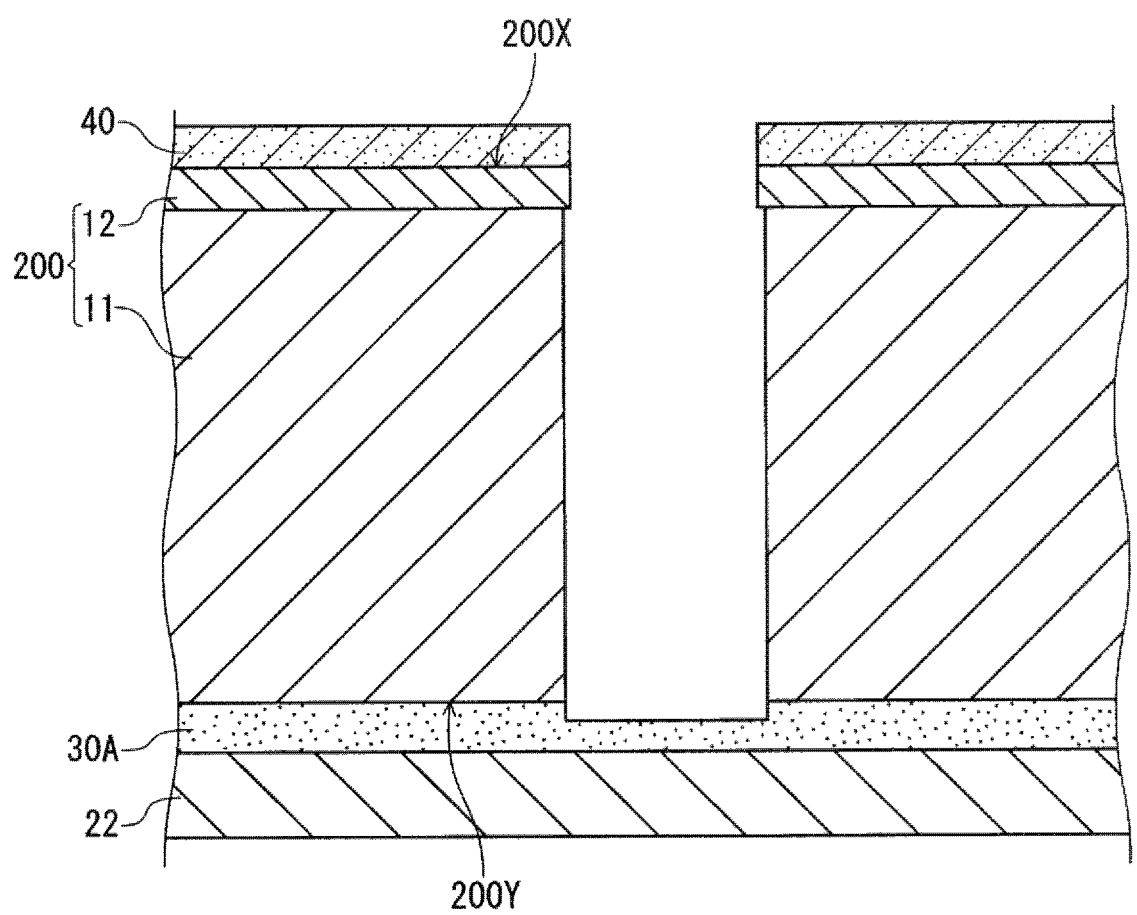
FIG. 3 is a schematic cross-sectional view of an essential part of the electronic components after a removal step at the 1st time according to the first embodiment of the present invention.

FIG. 3 is a schematic cross-sectional view of an essential part of the electronic components after the removal step at the 1st time. Together with the first film 50 deposited in the deposition step, part of the DAF 30A is removed, where the DAF 30A is thinned.

Figure 4:
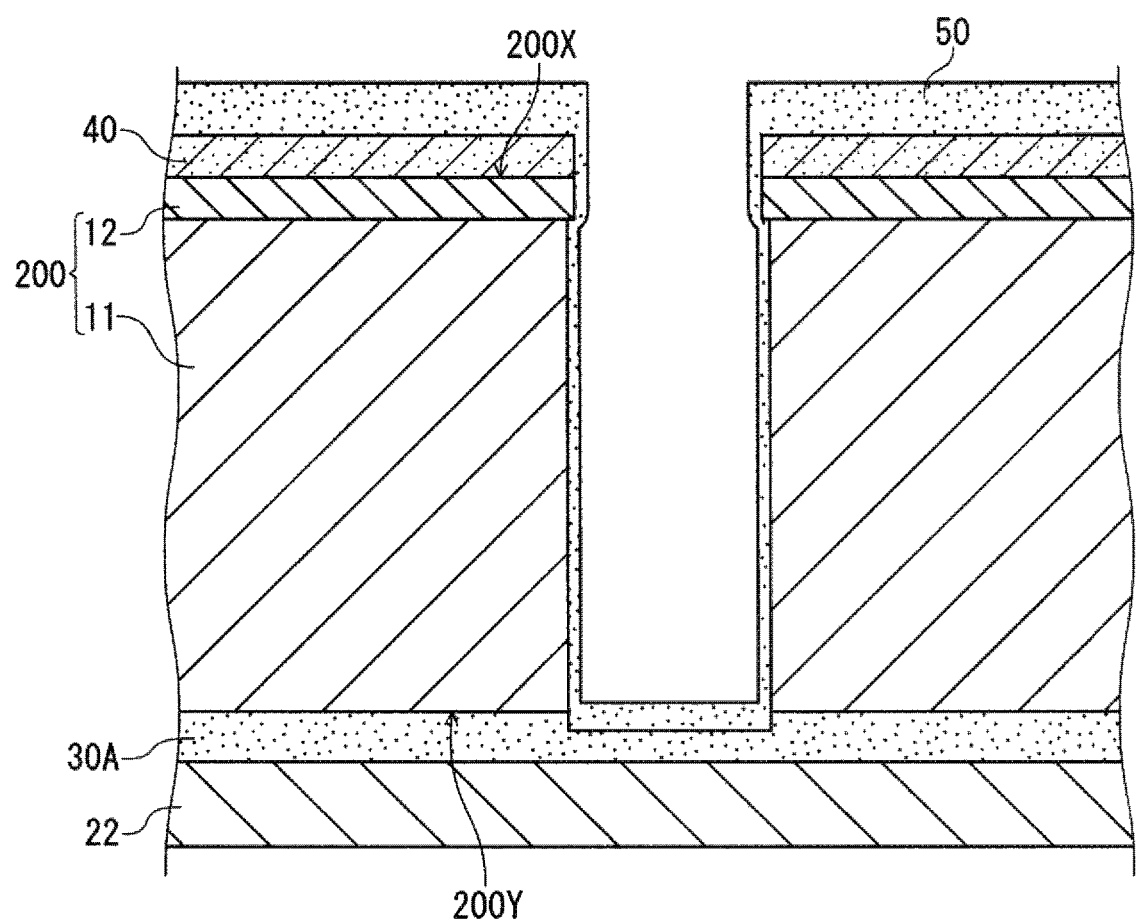
FIG. 4 is a schematic cross-sectional view of an essential part of the electronic components after the deposition step at the Nth time (N≥2) according to the first embodiment of the present invention.

FIG. 4 is a schematic cross-sectional view of an essential part of the electronic components after the deposition step at the Nth time (N≥2). The first film 50 is deposited on the surface of the protective film 40 and on the surface of the DAF 30A. The first film 50 on the DAF 30A is thinner than that on the protective film 40.

Figure 5:
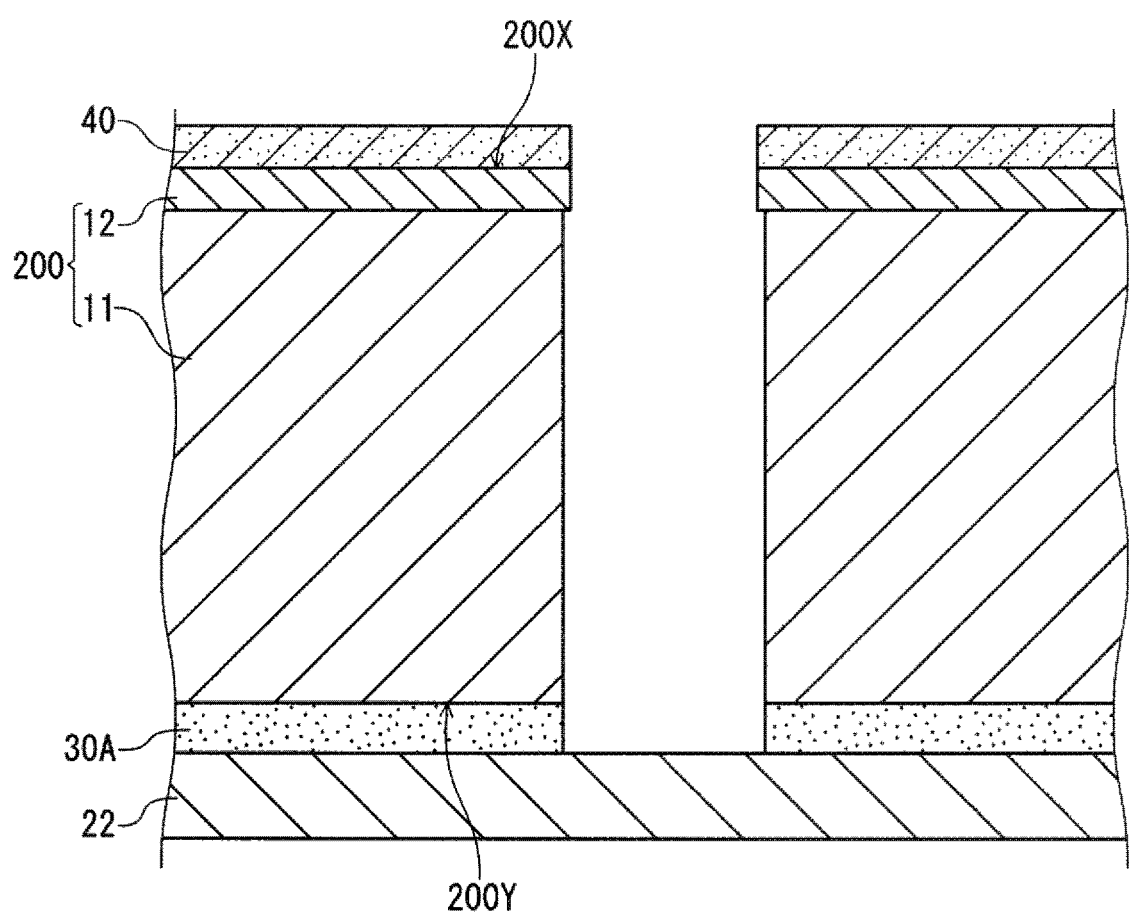
FIG. 5 is a schematic cross-sectional view of an essential part of the electronic components after the removal step at the Nth time (N≥2) according to the first embodiment of the present invention.

FIG. 5 is a schematic cross-sectional view of an essential part of the electronic components after the removal step at the Nth time (N≥2). The remaining part of the DAF 30A between the adjacent electronic components 200 is removed.

Second Embodiment

In the present embodiment, the resin layer is an adhesion layer. One or more electronic components are supported together with the adhesion layer by a support member. A stack of the electronic component(s), the adhesion layer, and the support member is, for example, a multilayer substrate. The deposition step and the removal step are repeated a plurality of times until the adhesion layer is removed.
(Adhesion Layer)

The adhesion layer may be made of any material which may be selected as appropriate depending on the materials of the substrate and the support member. The adhesion layer may be made of, for example, an uncured or semi-cured UV curable resin, an uncured or semi-cured thermosetting resin, a pressure-sensitive adhesive, or a thermoplastic resin. Examples of the UV curable resin include acrylic resin. Examples of the thermosetting resin include epoxy resin, polyimide, and polyamide-imide. Examples of the thermoplastic resin include polyester, polystyrene, and polytetrafluoroethylene. Examples of the pressure-sensitive adhesive include silicone resin.

The adhesion layer may have any thickness. The thickness of the adhesion layer may be, for example, 5 μm or more and 100 μm or less, and may be 5 μm or more and 15 μm or less.
(Support Member)

The support member supports the electronic components.

The support member may be made of any material. The support member may be, for example, a substrate, such as a glass substrate, a resin substrate, a glass epoxy substrate, a ceramic substrate, and a silicon substrate.

The support member may have any thickness. The thickness of the support member is, for example, 50 μm or more and 2 mm or less, and may be 100 μm or more and 500 μm or less.

The second embodiment will be specifically described below with reference to the drawings, in which the electronic component is illustrated as having a semiconductor layer and a wiring layer. The electronic component according to the present embodiment, however, is not limited thereto.

Figure 6:
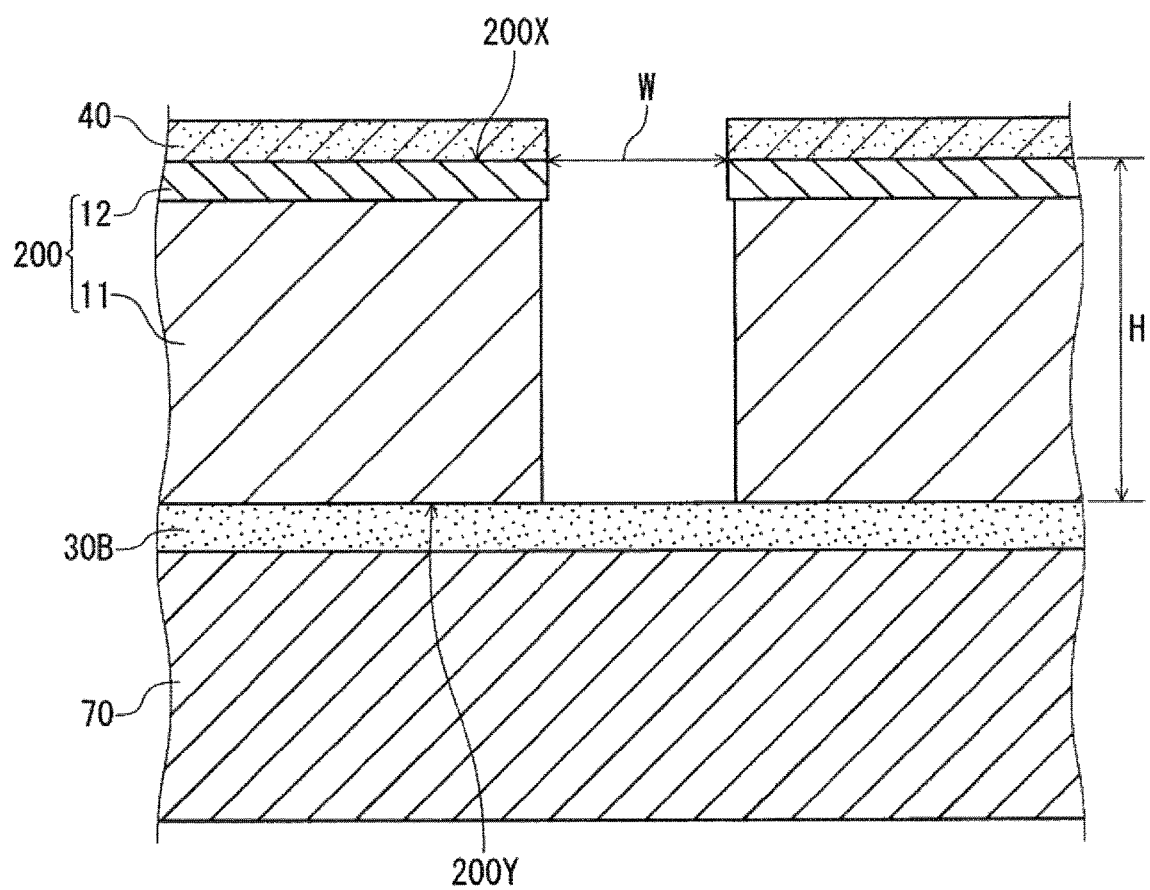
FIG. 6 is a schematic cross-sectional view of an essential part of the electronic components subject to a resin etching step according to a second embodiment of the present invention.

FIG. 6 is a schematic cross-sectional view of an essential part of the electronic components subject to the resin etching step. A plurality of electronic components 200 are supported together with an adhesion layer 30B by a support member 70. The electronic components 200 each include a semiconductor layer 11 and a wiring layer 12 disposed on the semiconductor layer 11 on a first surface 200X side. The first surface 200X is covered with a protective film 40. A second surface 200Y is attached to one surface of the adhesion layer (the resin layer) 30B. To the other surface of the adhesion layer 30B, the support member 70 is attached.

Figure 7:
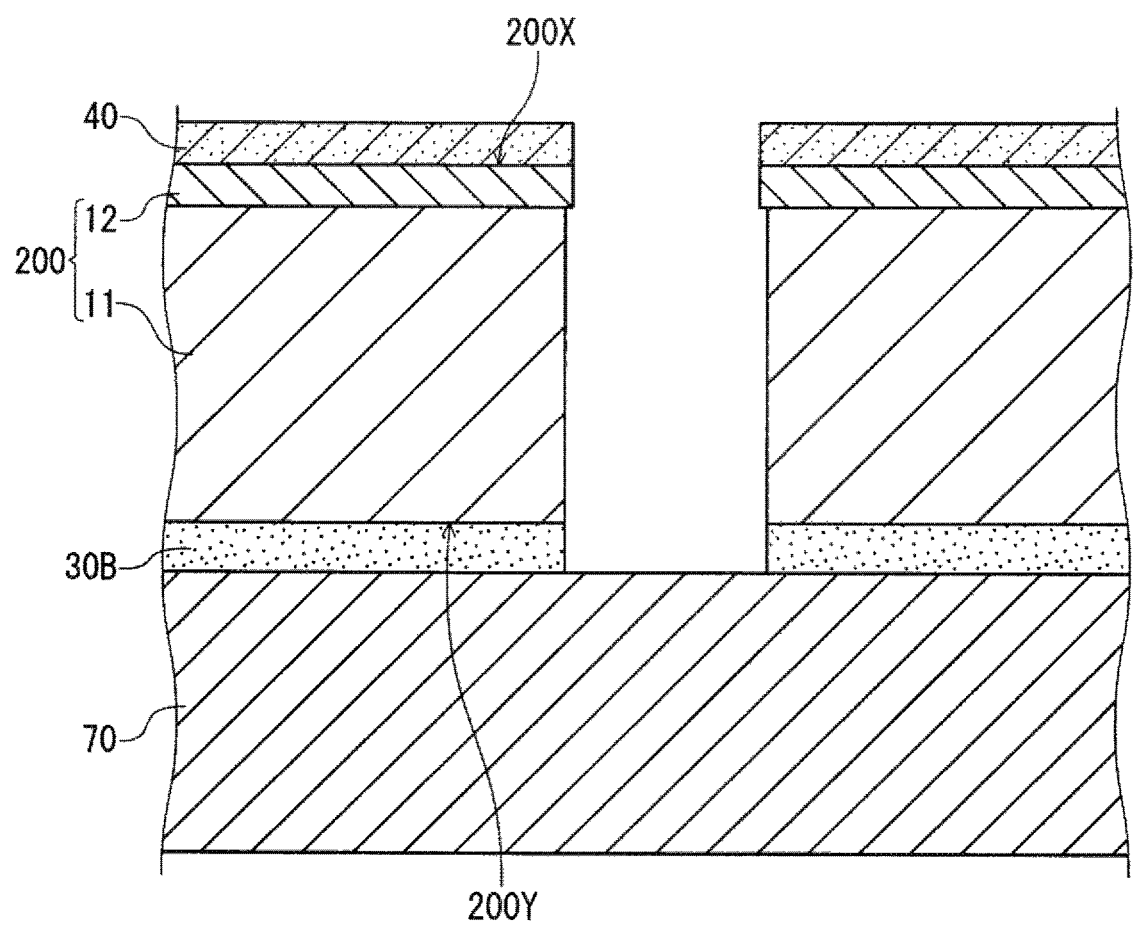
FIG. 7 is a schematic cross-sectional view of an essential part of the electronic components after the removal step at the Nth time (N≥2) according to the second embodiment of the present invention.

FIG. 7 is a schematic cross-sectional view of an essential part of the electronic components after the removal step at the Nth time (N≥2). The adhesion layer 30B is removed, and the support member 70 is exposed from between the adjacent electronic components 200. Between FIGS. 6 and 7, the deposition step and the removal step are repeated as shown from FIG. 2 to FIG. 4.

Next, a detailed description will be given below of an etching method including the above resin etching step.

A. Etching Method

An etching method according to the present embodiment includes: a preparation step of preparing a resin layer and an electronic component supported by the resin layer; and a resin etching step of etching the resin layer. The electronic component has a first surface covered with a protective film, a second surface opposite to the first surface, and a sidewall between the first surface and the second surface. The second surface is facing the resin layer. The resin layer is larger than the electronic component when seen from the first surface side.

Figure 8:
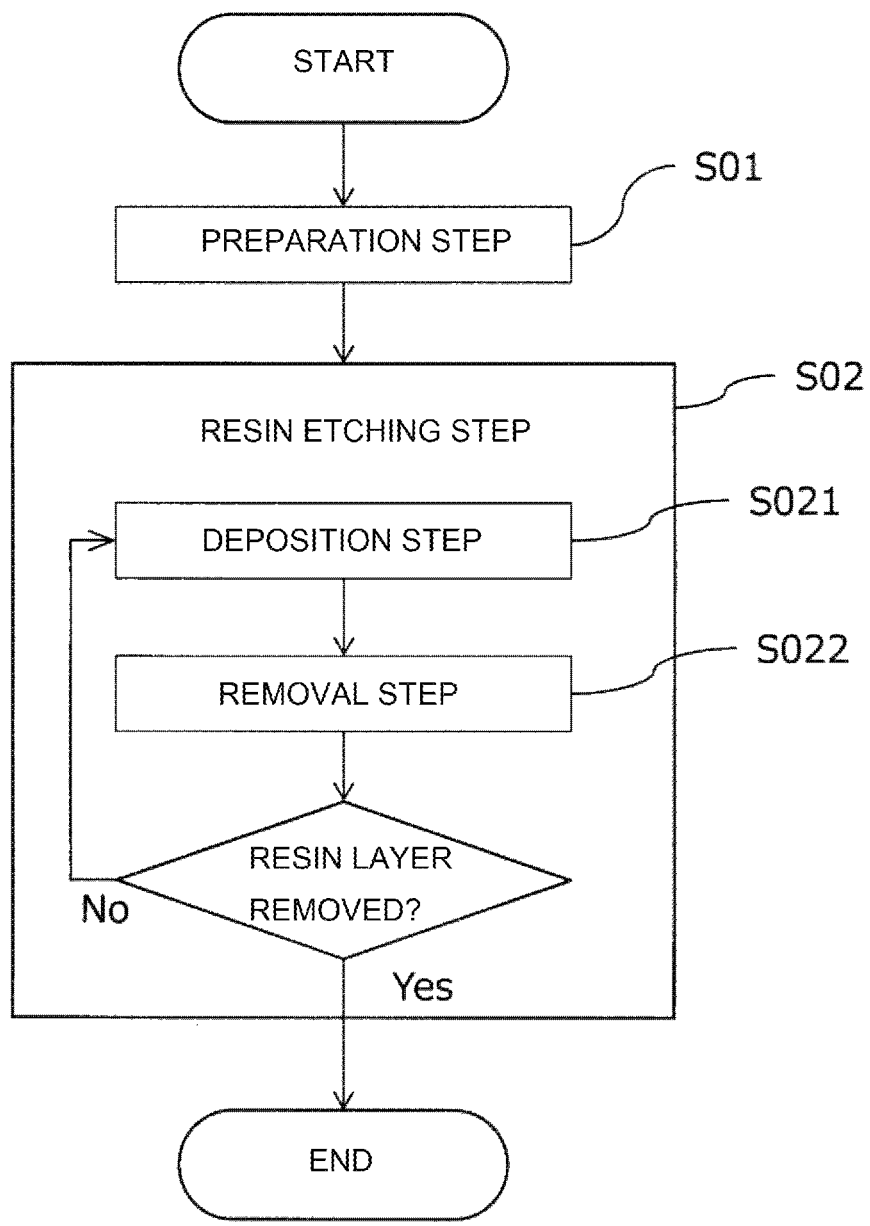
FIG. 8 is a flowchart of an etching method according to one embodiment of the present invention.

The resin etching step includes: a deposition step of depositing a first film, using a first plasma, on a surface of the protective film and a surface of the resin layer; and a removal step of removing, using a second plasma, the first film deposited on the resin layer and at least part of the resin layer. The deposition step and the removal step are alternately repeated a plurality of times, with the protective film allowed to continue to exist. FIG. 8 is a flowchart of the etching method according to the present embodiment.

(i) Preparation Step (S01)

At least one electronic component and a resin layer supporting the at least one electronic component are prepared. The electronic component has a first surface covered with a protective film, a second surface opposite to the first surface, and a sidewall between the first surface and the second surface. The second surface of the electronic component is facing the resin layer. The electronic component is, for example, an element chip produced by plasma-dicing a substrate through a Bosch process. The sidewall may have an uneven or scalloped surface.

The electronic component includes, for example, a semiconductor layer and a wiring layer.

The semiconductor layer contains, for example, silicon (Si), gallium arsenide (GaAs), gallium nitride (GaN), silicon carbide (SiC), or the like. The semiconductor layer in the electronic component may have any thickness; the thickness is, for example, 20 μm or more and 1000 μm or less, and may be 50 μm or more and 300 μm or less.

The wiring layer constitutes, for example, a semiconductor circuit, an electronic component element (e.g., LED, laser, MEMS), and may include an electrically insulating film, a metal material, a resin film (e.g., polyimide), a resist layer, an electrode pad, a bump, and others. The insulating film may be in the form of a laminate with a wiring metal material (e.g., multilevel wiring layer, redistribution layer).

The protective film contains, for example, a resist material, such as a thermosetting resin (e.g., polyimide), a photoresist (e.g., phenol resin), or a water-soluble resist (e.g., acrylic resin). The protective film containing such a resist material is, usually, formed for protecting the electronic component during production and is removed before the electronic component is completed. The insulating film (e.g., silicon nitride, silicon oxide film) and/or the resin film (polyimide) disposed at the outermost layer of the electronic component can serve as the protective film. Such a protective film including the insulating film is formed for protecting the electronic component during production as well as after distribution, and is not removed.

The protective film may have any thickness. When the protective film is formed of the aforementioned resist material, however, the protective film is preferably thick enough so as not to be completely removed by the etching step using a Bosch process. The thickness of the protective film can be set, for example, by calculating an amount (thickness) of the protective film to be etched in the above etching step, to be thicker than the calculated amount. The thickness of the protective film is, for example, 5 μm or more and 60 μm or less. Note that when the protective film is the above insulating film and the like, the conditions for the Bosch process are adjusted such that the protective film is etched by a few μtm or less in the above etching step.

When a plurality of the electronic components are processed simultaneously in the resin etching step, for ease of handling, the electronic components are preferably attached to a holding sheet secured to a frame. A member comprising a frame and a holding sheet secured to the frame is referred to as a conveying carrier.

(Conveying Carrier)

The frame is a frame member having an opening large enough to surround a plurality of the electronic components. The frame has a predetermined width and a thickness which is substantially consistently thin. The frame has such a rigidity that it can be conveyed with the holding sheet and the electronic components held thereon. The opening of the frame may be of any shape, for example, circular, rectangular, or polygonal, such as hexagonal. The frame may be made of any material, for example, a metal, such as aluminum or stainless steel, or a resin.

The holding sheet may be made of any material. For easy attachment of the electronic components thereto, the holding sheet preferably includes an adhesive layer and a non-adhesive layer with flexibility.

The non-adhesive layer may be made of any material, and may be, for example, a thermoplastic resin, such as polyolefin (e.g., polyethylene, polypropylene), and polyester (e.g., polyvinyl chloride, polyethylene terephthalate). The resin material may be blended with a rubber component for adding elasticity (e.g., ethylene-propylene rubber (EPM), ethylene-propylene-diene rubber (EPDM)), and various additives, such as a plasticizer, a softener, an antioxidant, and an electrically conductive material. The above thermoplastic resin may have a functional group that reacts during photopolymerization reaction, such as an acryl group. The non-adhesive layer may have any thickness; the thickness is, for example, 50 μm or more and 300 μm or less, preferably 50 μm or more and 150 μm or less.

The holding sheet is attached at its periphery to the frame, with the side where the adhesive layer is disposed (adhesive side) in contact with the frame, to cover the opening of the frame. On the adhesive side exposed from the opening of the frame, the electronic components having the resin layer are attached indirectly.

The adhesive layer is preferably made of an adhesive component, the adhesive strength of which is reduced by ultraviolet (UV) irradiation. In this case, when picking up the electronic components after a protective film removal step, the electronic components can be easily peeled off from the adhesive layer by UV irradiation, which eases the pickup. The adhesive layer can be obtained by, for example, applying a UV curing acrylic adhesive on one side of the non-adhesive layer, in a thickness of 5 μm or more and 100 μm or less, preferably 5 μm or more and 15 μm or less.

The protective film removal step will be specifically described later.

Figure 9A:
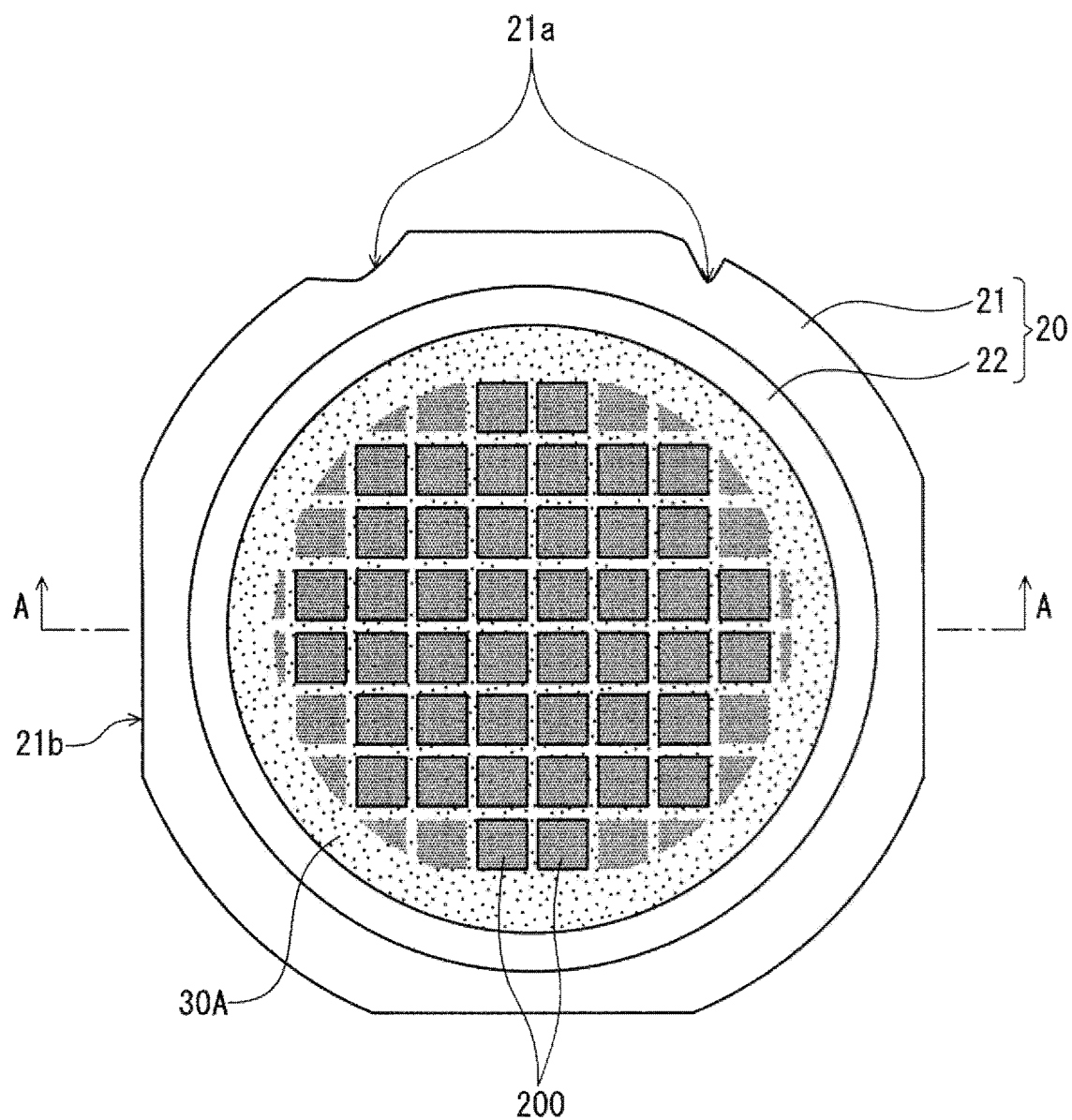
FIG. 9A is a schematic top view of the electronic components prepared in a preparation step according to one embodiment of the present invention.
Figure 9B:
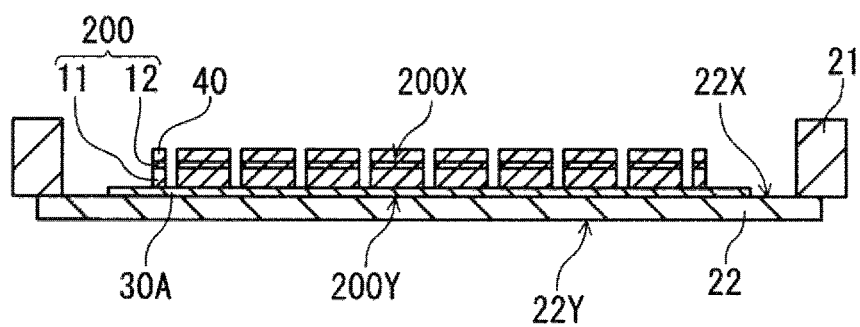
FIG. 9B is a cross-sectional view taken along line A-A in FIG. 9A.

FIG. 9A is a schematic top view of the electronic components prepared in the preparation step. FIG. 9B is a cross-sectional view taken along line A-A in FIG. 9A. In FIGS. 9A and 9B, the resin layer is a DAF. The electronic components are supported by the DAF and the holding sheet.

A conveying carrier 20 includes a frame 21 and a holding sheet 22 secured to the frame 21. The frame 21 may be provided with a notch 21a and a corner cut 21b for correct positioning. The holding sheet 22 has an adhesive side 22X and a non-adhesive side 22Y, and the adhesive side 22X is attached at its periphery to one side of the frame 21. On a portion of the adhesive side 22X exposed from the opening of the frame 21, a DAF 30A supporting electronic components 200 is attached.

A plurality of the electronic components 200 are attached, with a space therebetween, to the DAF 30A. The DAF 30A is exposed from between the adjacent electronic components 200. Such a plurality of the electronic components 200 can be obtained by plasma-dicing a substrate through a Bosch process. The electronic components 200 each include a semiconductor layer 11 and a wiring layer 12 disposed on the semiconductor layer 11 on a first surface 200X side. The first surface 200X of the electronic components 200 is covered with a protective film 40.

Figure 10A:
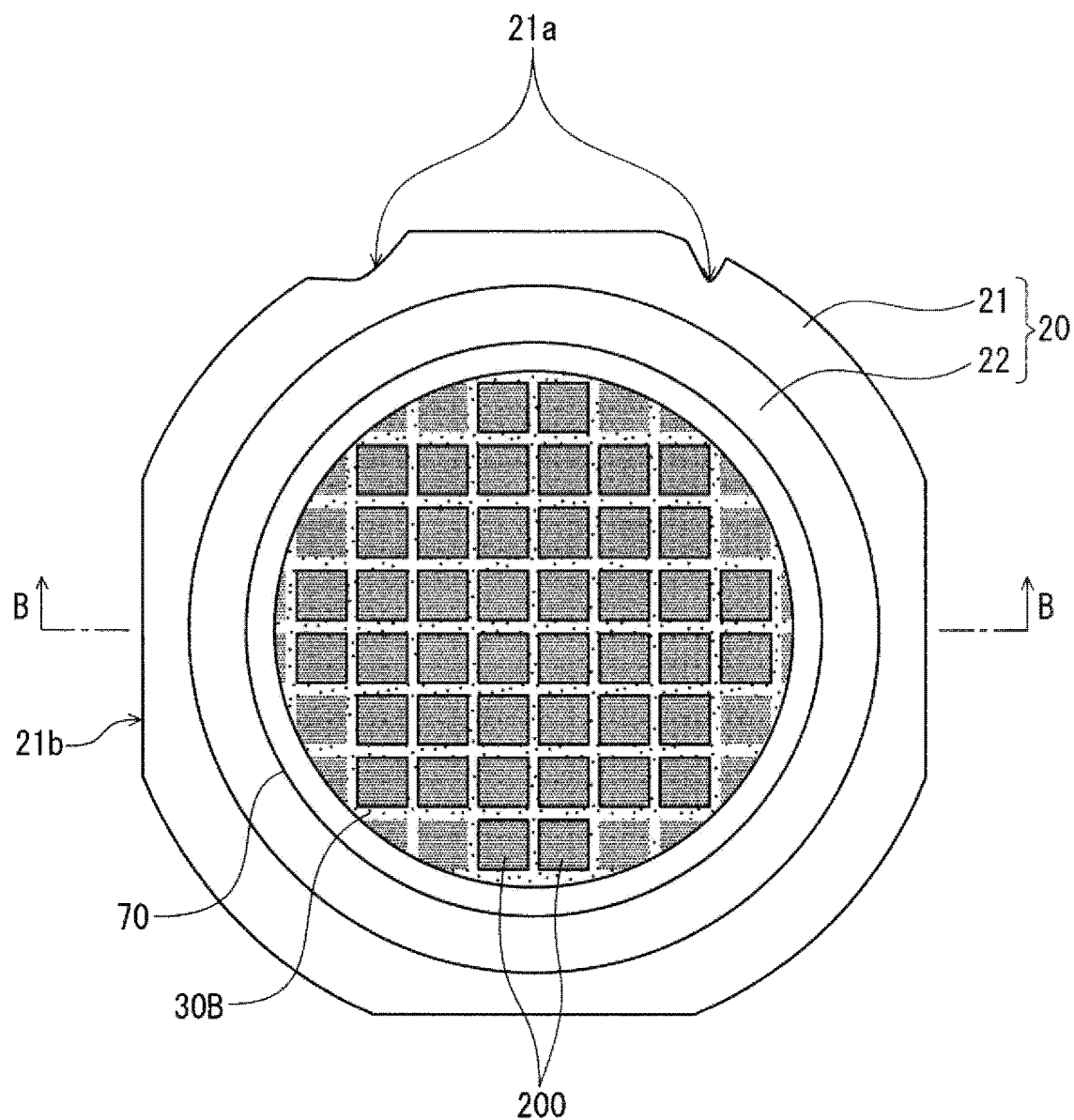
FIG. 10A is a schematic top view of the electronic components prepared in a preparation step according to another embodiment of the present invention.
Figure 10B:
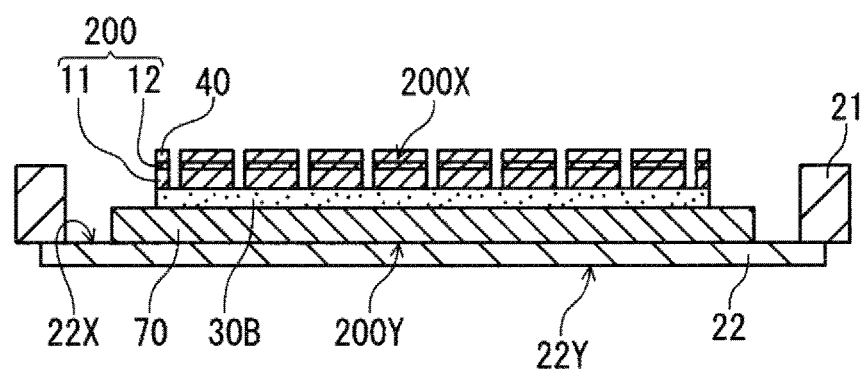
FIG. 10B is a cross-sectional view taken along line B-B in FIG. 10A.

FIG. 10A is a schematic top view of other electronic components prepared in the preparation step. FIG. 10B is a cross-sectional view taken along line B-B in FIG. 10A. In FIGS. 10A and 10B, the resin layer is an adhesion layer. The electronic components are supported by the adhesion layer and the support member.

The conveying carrier 20 has a configuration similar to that illustrated by FIGS. 9A and 9B. On a portion of the adhesive side 22X exposed from the opening of the frame 21, the support member 70 supporting the electronic components 200 is attached. A plurality of the electronic components 200 are attached, with a space therebetween, to an adhesion layer 30B. The adhesion layer 30B is exposed from between the adjacent electronic components 200. Such a plurality of the electronic components 200 can be obtained by plasma-dicing a substrate through a Bosch process.

(ii) Resin Etching Step (S02)

A resin etching step is implemented by the deposition step (S021) and the removal step (S022) described above in (a) and (b). According to the resin etching step, the resin layer can be removed, with the protective film allowed to continue to exist. The deposition step and the removal step are repeated until the resin layer is removed.

B. Element Chip Manufacturing Method

An element chip manufacturing method according to the present embodiment includes: a preparation step of preparing a stack, the stack including a substrate having a first surface and a second surface opposite to the first surface, and a resin layer disposed facing the second surface, the substrate having a plurality of element regions and dicing regions defining the element regions; a protective film formation step of covering the first surface with a protective film; an aperture formation step of removing at least the protective film along the dicing regions, to form apertures; a substrate etching step of etching the substrate exposed from the apertures, from the first surface to the second surface; and a resin etching step of etching the resin layer exposed at a bottom of grooves formed by etching of the substrate, after the substrate etching step. In the case where the substrate is provided with a protective film in advance, the protective film formation step is omitted.

Figure 11:
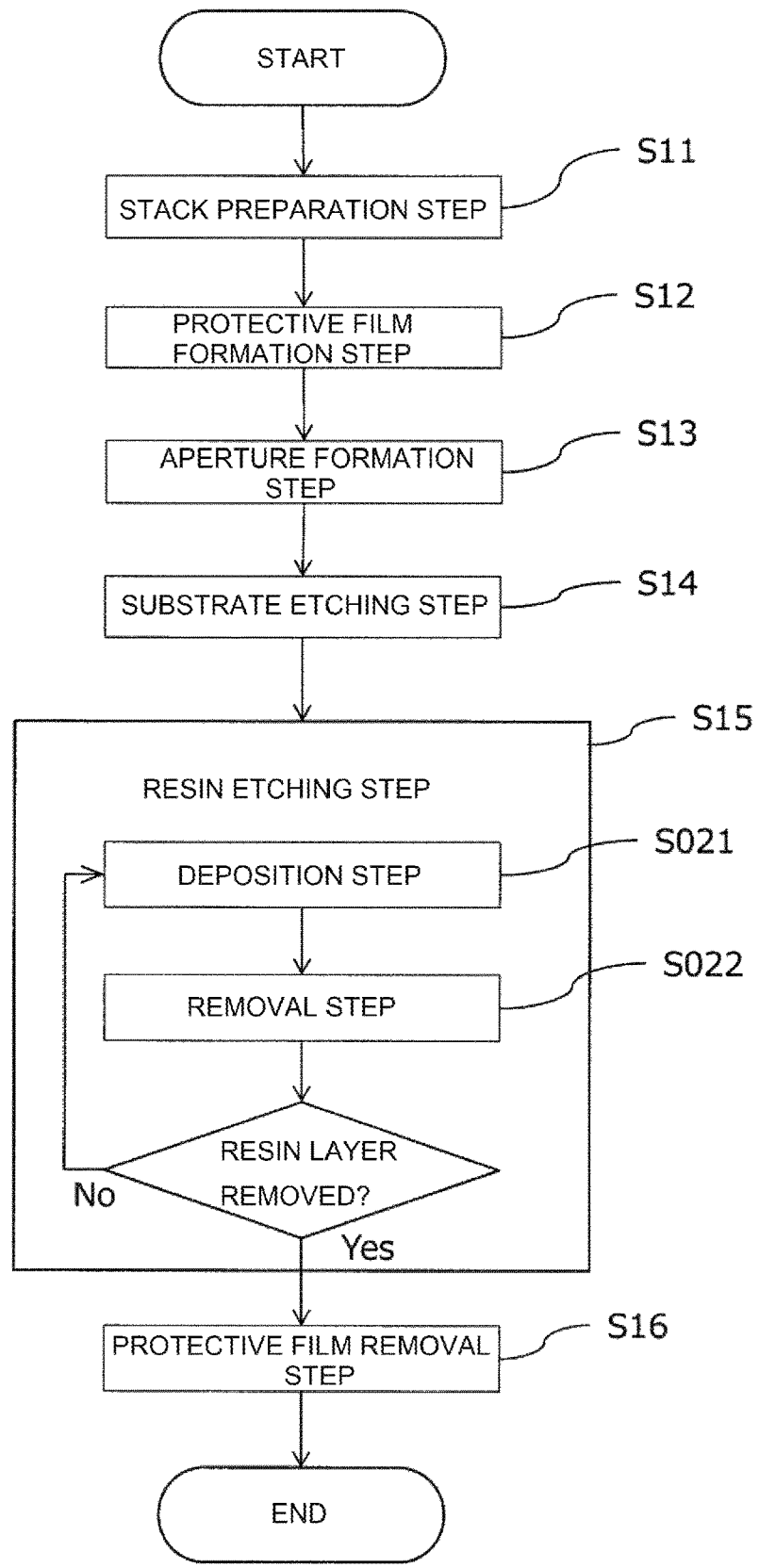
FIG. 11 is a flowchart of an element chip manufacturing method according to one embodiment of the present invention.

The resin etching step includes: a deposition step of depositing a first film, using a first plasma, on a surface of the protective film and a surface of the resin layer; and a removal step of removing, using a second plasma, the first film deposited on the resin layer and at least part of the resin layer. The deposition step and the removal step are alternately repeated a plurality of times, with the protective film allowed to continue to exist. FIG. 11 is a flowchart of the element chip manufacturing method according to the present embodiment.

(1) Stack Preparation Step (S11)

A stack serving as an object to be processed is prepared first.

The stack includes a substrate and an adhesion layer.

The adhesion layer may be formed by attaching an adhesion layer shaped in advance in a predetermined shape, onto a second surface of the substrate, or by applying a raw material (adhesive) of the adhesion layer onto the second surface of the substrate.

(Substrate)

The substrate has a first surface and a second surface, and has a plurality of element regions and dicing regions defining the element regions. The substrate includes the above semiconductor layer. The element regions of the substrate may further include the above wiring layer. The dicing regions of the substrate may further include an electrically insulating film and a metal material, such as TEG (Test Element Group). Etching the substrate along the dicing regions can provide a plurality of element chips.

The substrate may be of any size, and is, for example, about 50 mm or more and 300 mm or less in maximum diameter. The substrate may be of any shape, and is, for example, circular or rectangular. The substrate may be provided with a cut, such as an orientation flat or a notch.

The shape of the dicing regions may be set as appropriate depending on the desired shape of element chips, without limited to a straight linear shape, and may be, for example, a zig-zag shape or a wavy line shape. Note that the shape of element chips is, for example, rectangular or hexagonal.

The width of the dicing regions may be set as appropriate depending on the size of the substrate or the element chips, and others. The width of the dicing regions is, for example, 10 μm or more and 300 μm or less. A plurality of the dicing regions may have the same width or different widths. The dicing region is typically formed in plural numbers on the substrate. The pitch between the dicing regions adjacent to each other also is not limited, and may be set as appropriate depending on the size of the substrate or the element chips, and others.

(Resin Layer)

The resin layer may mainly contain an organic material (50% by mass or more). Examples of the resin layer include a DAF and an adhesion layer as mentioned above.

The stack may be attached to a holding sheet secured to a frame. This improves the ease of handling. Etching the stack attached to a holding sheet can provide a plurality of electronic components arranged with a space therebetween on the holding sheet. The shape, the material, and the like of the frame and the holding sheet are as described above.

(2) Protective Film Formation Step (S12)

A protective film covering the first surface of the substrate is formed.

The protective film is provided for protecting the element regions of the substrate from plasma exposure and the like. After the resin etching step, the protective film is removed. The material and the thickness of the protective film are as described above.

The protective film can be formed by, for example, forming a resist material into a sheet and attaching the sheet to the substate, or by applying a liquid raw material of a resist material to the substrate using spin-coating or spray-coating technique. By changing the amount of the liquid raw material while applying, the thickness of the protective film can be partially changed. Spin-coating and spray-coating may be used in combination, by which the coating amount may be adjusted.

(3) Aperture Formation Step (S13)

Apertures are formed in the protective film, to expose the dicing regions of the substrate.

The apertures is formed, for example, in the protective film formed of a resist material, by removing the protective film along the dicing regions by photolithography. In the protective film formed of a thermosetting resin or water-soluble resist, the apertures may be formed by removing the protective film along the dicing regions by laser-scribing patterning.

The apertures may be formed by removing the protective film and the wiring layer along the dicing regions. The removal of the wiring layer along the dicing regions may be performed in a substrate etching step as described later. In this case, a plasma for removing the protective film and a plasma for etching the substrate may be generated under different conditions.

After the aperture formation step and before the substrate etching step, the apertures may be irradiated with a laser beam or a plasma. This is for the purpose of, for example, reducing the residue caused by the aperture formation step. This enables to perform high-quality plasma etching.

(4) Substrate Etching Step (S14)

The substrate is exposed to a plasma, to etch the dicing regions exposed from the apertures, to the second surface, to form a plurality of element chip from the substrate. In this step, the resin layer may or may not be etched.

The substrate etching step is performed by a Bosch process. The Bosch process includes one or more cycles each consisting of an etching step of forming grooves along the dicing regions and a deposition step of depositing a film on the inner walls of the grooves. The above film (deposited film) removal step is performed between the etching step and the deposition step.

In the first cycle, shallow recesses are formed along the dicing regions by the etching step. This is followed by the deposition step, and a deposited film is formed on the inner walls of the shallow recesses. The second step begins with the deposited film removal step. The deposited film removal step is implemented by anisotropic etching. Specifically, of the film deposited on the inner walls of the recesses, the film covering the bottom is removed. In the subsequent etching step, the bottom of the recesses is etched isotropically. This etching step is followed by the deposition step again, and a deposited film is formed on the inner walls of the recesses. Repeating the second cycle (deposited film removal step, etching step, and deposition step) provides at least one element chip having a first surface covered with the protective film, a second surface, and a sidewall. The sidewall of the element chip thus provided may have a scalloped surface.

The deposited film removal step is performed, for example, under the following conditions. $SF_6$ and $O_2$ are supplied as process gases respectively at a rate of 200 sccm or more and 1000 sccm less and at a rate of 0 sccm or more and 20 sccm or less into the vacuum chamber. The vacuum chamber is set at a pressure of 5 Pa or more and 30 Pa or less. A high-frequency power of 1500 W or more and 4800 W or less is applied to the first electrode, and a high-frequency power of 50 W or more and 200 W or less is applied to the second electrode. The processing time is 1 s or more and 5 s or less.

The etching step is performed, for example, under the following conditions. $SF_6$ and $O_2$ are supplied as process gases respectively at a rate of 200 sccm or more and 1000 sccm less and at a rate of 0 sccm or more and 20 sccm or less into the vacuum chamber. The vacuum chamber is set at a pressure of 5 Pa or more and 30 Pa or less. A high-frequency power of 1500 W or more and 4800 W or less is applied to the first electrode, and a high-frequency power of 0 W or more and 100 W or less is applied to the second electrode. The processing time is 3 s or more and 30 s or less.

The deposition step is performed, for example, under the following conditions. $C_4F_8$ is supplied as a process gas at a rate of 100 sccm or more and 600 sccm less into the vacuum chamber. The vacuum chamber is set at a pressure of 5 Pa or more and 30 Pa or less. A high-frequency power of 1500 W or more and 4800 W or less is applied to the first electrode, and a high-frequency power of 0 W or more and 100 W or less is applied to the second electrode. The processing time is 1 s or more and 10 s or less.

By repeating the deposition step, the deposited film removal step, and the etching step under the conditions as above, the semiconductor layer can be etched vertically in the depth direction at a rate of 10 μm/min or more and 20 μm/min or less.

(5) Resin Etching Step (S15)

Removing the substrate along the dicing regions leaves grooves in the stack. The resin layer is exposed at the bottom of the grooves. The exposed resin layer is etched and removed. The resin etching step is implemented by the resin etching step (ii) as described above in the etching method. According to the resin etching step of the present embodiment, the resin layer can be removed, with the protective film allowed to continue to exist.

The substrate etching step and the resin etching step may be performed in the same or different plasma processing apparatus. When performed in the same plasma processing apparatus, these etching steps may be performed successively one after the other.

(6) Protective Film Removal Step (S16)

The protective film may be removed after the last removal step. When the protective film is an electrically insulating film and/or a resin film at the outermost layer of the electronic component, the protective film may not be necessarily removed because it is formed for protecting the electronic component during production as well as after distribution.

The protective film is removed using, for example, a third plasma generated from a third process gas including oxygen gas (02). The third process gas may include $O_2$ and a fluorine-containing gas. Examples of the fluorine-containing gas include compounds as mentioned above. The proportion of $O_2$ in the third process gas may be 10 vol % or more and less than 100 vol %, and may be 30 vol % or more and 98 vol % or less.

The conditions for generating the third plasma may be set as appropriate depending on the amount, components, and the like of the protective film.

The conditions for generating the third plasma are, for example, as follows. A mixed gas of $CF_4$ and $O_2$ (ratio of flow rate of $CF_4$ to $O_2$=greater than 0% and 10% or less) is supplied as an ashing gas at 50 sccm or more and 600 sccm or less into the vacuum chamber. The vacuum chamber is set at a pressure of 1 Pa or more and 30 Pa or less. A high-frequency power EA1 of 1000 W or more and 4800 W or less is applied to the first electrode, and a high-frequency power EA2 of 0 W or more and 100 W or less is applied to the second electrode. The high-frequency power EA2 applied to the second electrode in the ashing step is desirably set smaller than that applied to the second electrode in the etching step. The processing time is determined as appropriate depending on the amount of the protective film, and is, for example, 3 s or more and 300 s or less.

When the protective film is water-soluble, the protective film may be removed by washing with water, instead of using the third plasma.

After the resin etching step or the protective film removal step, the element chips are detached from the holding sheet.

The element chips are, for example, thrust upward together with the holding sheet with thrust-up pins from the non-adhesive side of the holding sheet. This allows at least part of the element chip to float from the holding sheet. The element chips are then detached from the holding sheet by a pickup device.

A detailed description will be given below of the manufacturing method of element chips, with reference to the drawings. It is to be noted, however, the present embodiments are not limited thereto.

Embodiment I

Figure 12:
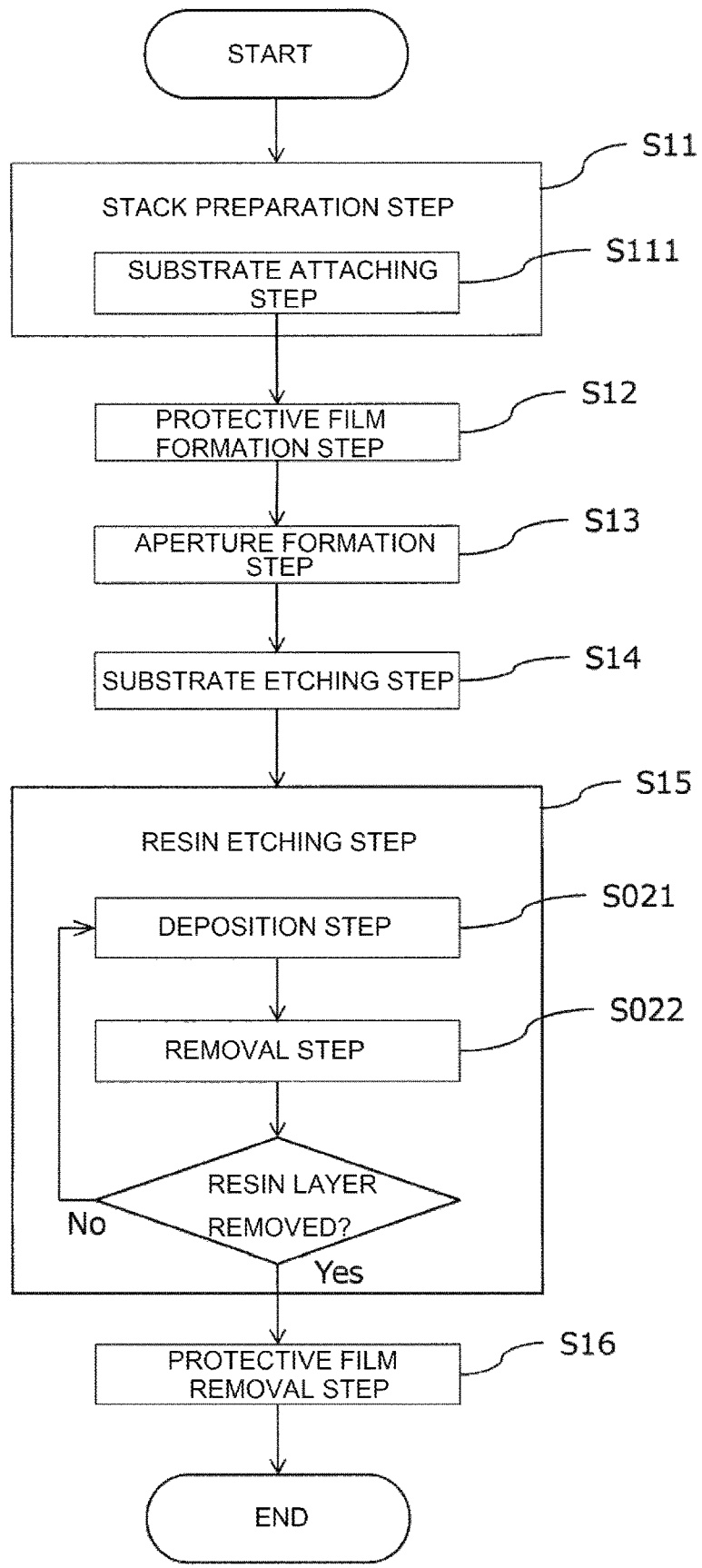
FIG. 12 is a flowchart of an element chip manufacturing method according to an embodiment I of the present invention.

In the embodiment I, the resin layer is a DAF. The stack preparation step includes a step (S111) of attaching a substrate via a DAF to a holding sheet secured to a frame. The present embodiment is implemented through the steps as described above. FIG. 12 is a flowchart of the manufacturing method according to the present embodiment.

In the step of attaching a substrate, the substrate may be attached to the DAF disposed on the holding sheet. In this case, the DAF is formed by, for example, applying a resin composition as mentioned above which is a material of the DAF onto the holding sheet at a predetermined position. The DAF may be shaped in advance in a predetermined shape, and then disposed on the holding sheet at a predetermined position.

Figure 13:
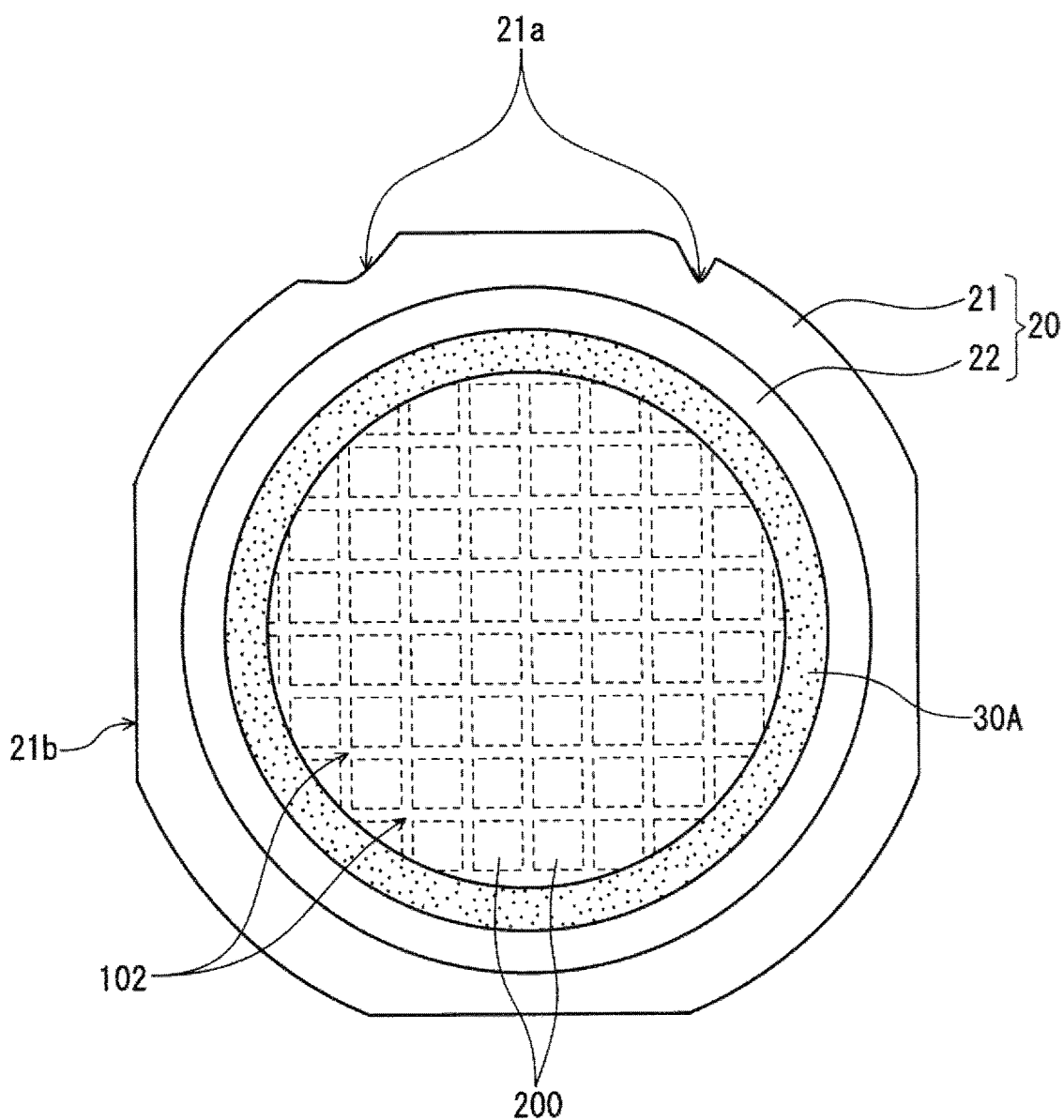
FIG. 13 is a schematic top view of a stack prepared in a preparation step according to the embodiment I of the present invention.
Figure 14:
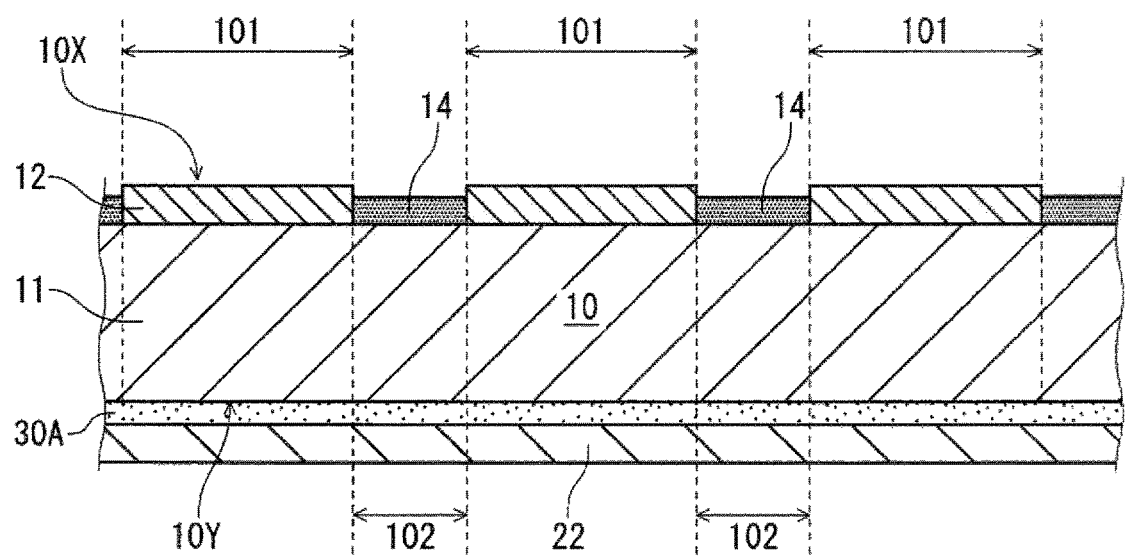
FIG. 14 is a schematic partial cross-sectional view of the stack prepared in a preparation step according to the embodiment I of the present invention.

FIG. 13 is a schematic top view of a stack prepared in the stack preparation step according to the present embodiment. FIG. 14 is a schematic partial cross-sectional view of the stack. The stack includes a substrate 10 and a DAF 30A. The stack is attached to a holding sheet 22 secured to the frame. The substrate 10 has a first surface 10X and a second surface 10Y, and has a plurality of element regions 101 and dicing regions 102 defining the element regions 101. The element regions 101 each include a semiconductor layer 11 and a wiring layer 12 disposed on the semiconductor layer 11 on the first surface 10X side. The dicing regions 102 each include the semiconductor layer 11 and an electrically insulating film 14.

Figure 15:
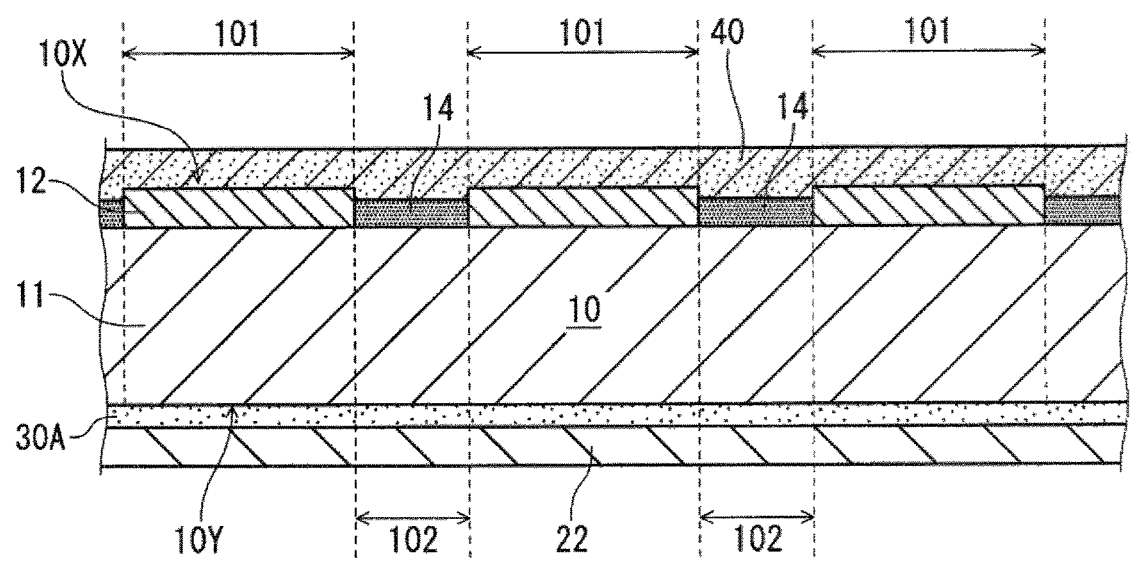
FIG. 15 is a schematic partial cross-sectional view of the stack after a protective film formation step according to the embodiment I of the present invention.

FIG. 15 is a schematic partial cross-sectional view of the stack after the protective film formation step according to the embodiment I. A protective film 40 is formed on the first surface 10X of the substrate 10.

Figure 16:
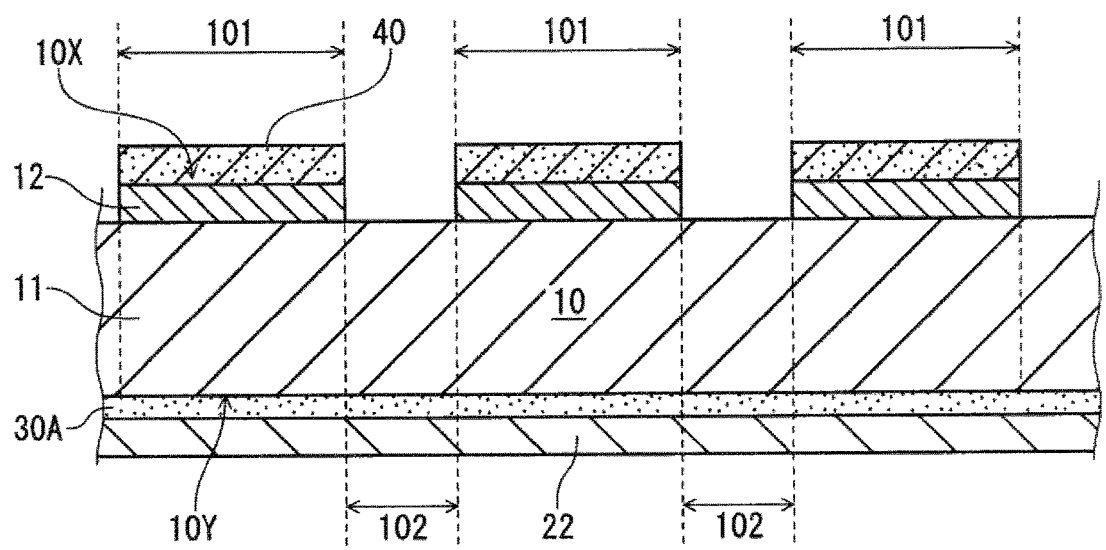
FIG. 16 is a schematic partial cross-sectional view of the stack after an aperture formation step according to the embodiment I of the present invention.

FIG. 16 is a schematic partial cross-sectional view of the stack after the aperture formation step according to the present embodiment. The protective film 40 and the insulating film 14 in the dicing regions 102 are removed, and the semiconductor layer 11 is exposed from the apertures along the dicing regions 102.

Figure 17:
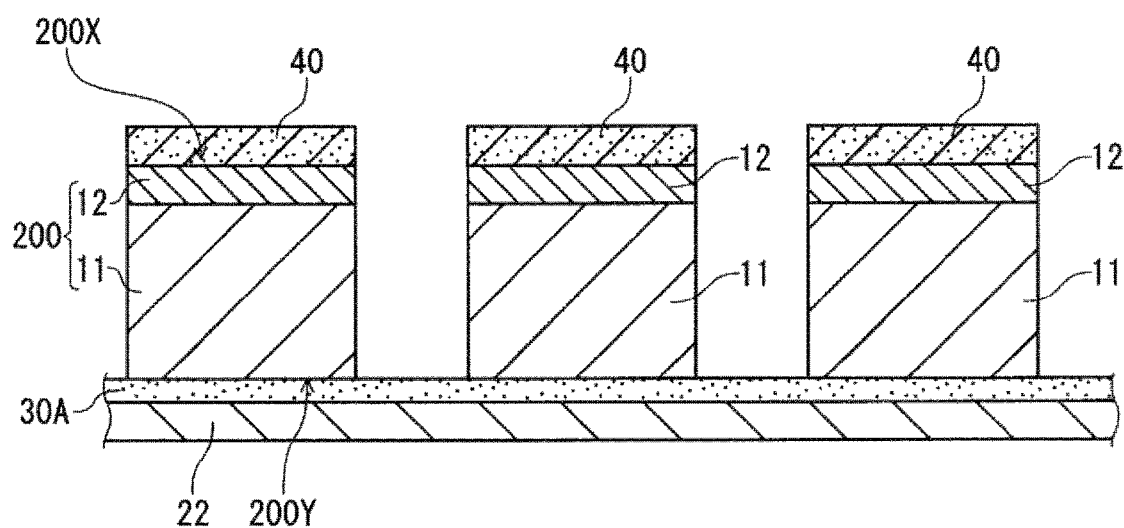
FIG. 17 is a schematic partial cross-sectional view of element chips produced in a substrate etching step according to the embodiment I of the present invention.

FIG. 17 is a schematic partial cross-sectional view of element chips produced in the substrate etching step according to the present embodiment. The substrate is etched along the dicing regions 102 and divided into a plurality of element chip 200. The first surface 200X of the element chips 200 is covered with the protective film 40. The DAF 30A is exposed from between the adjacent element chips 200.

Figure 18:
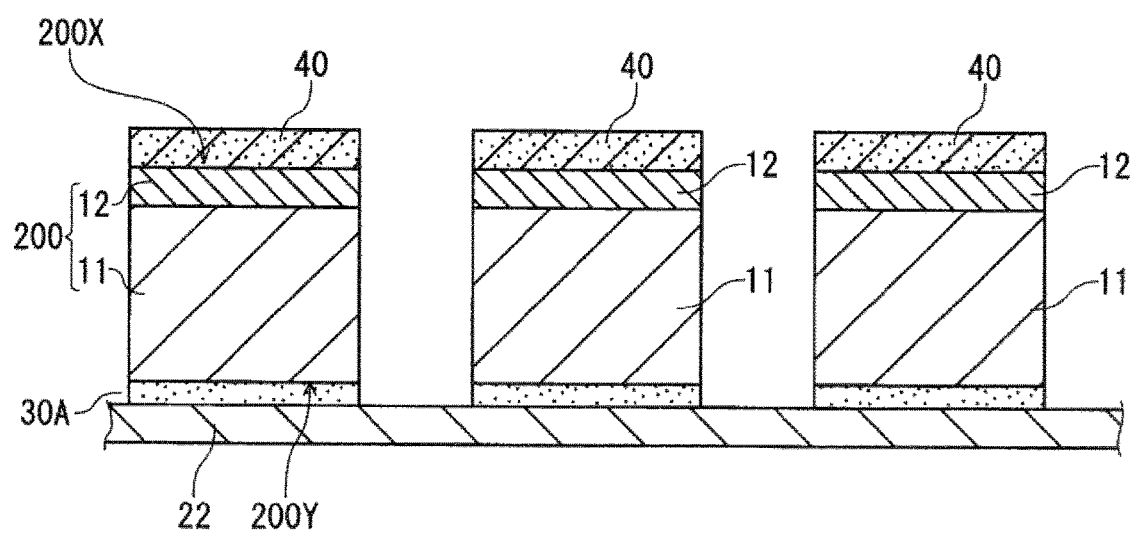
FIG. 18 is a schematic partial cross-sectional view of the element chips after a resin etching step according to the embodiment I of the present invention.

FIG. 18 is a schematic partial cross-sectional view of the element chips after the resin etching step according to the present embodiment. The exposed DAF 30A is removed.

Figure 19:
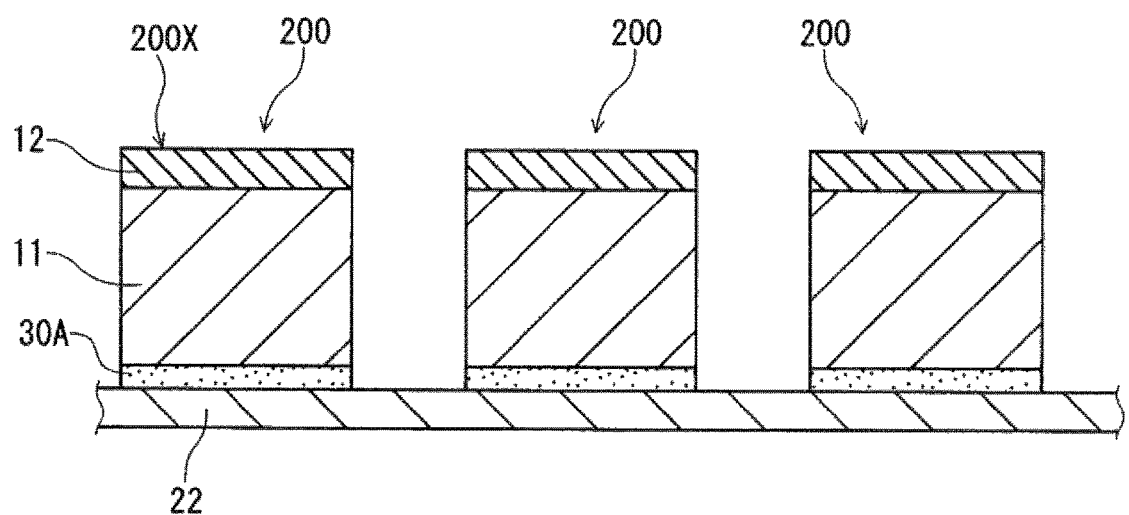
FIG. 19 is a schematic partial cross-sectional view of the element chips after a protective film removal step according to the embodiment I of the present invention.

FIG. 19 is a schematic partial cross-sectional view of the element chips after the protective film removal step according to the present embodiment. The protective film 40 is removed from the first surface 200X.

Embodiment II

Figure 20:
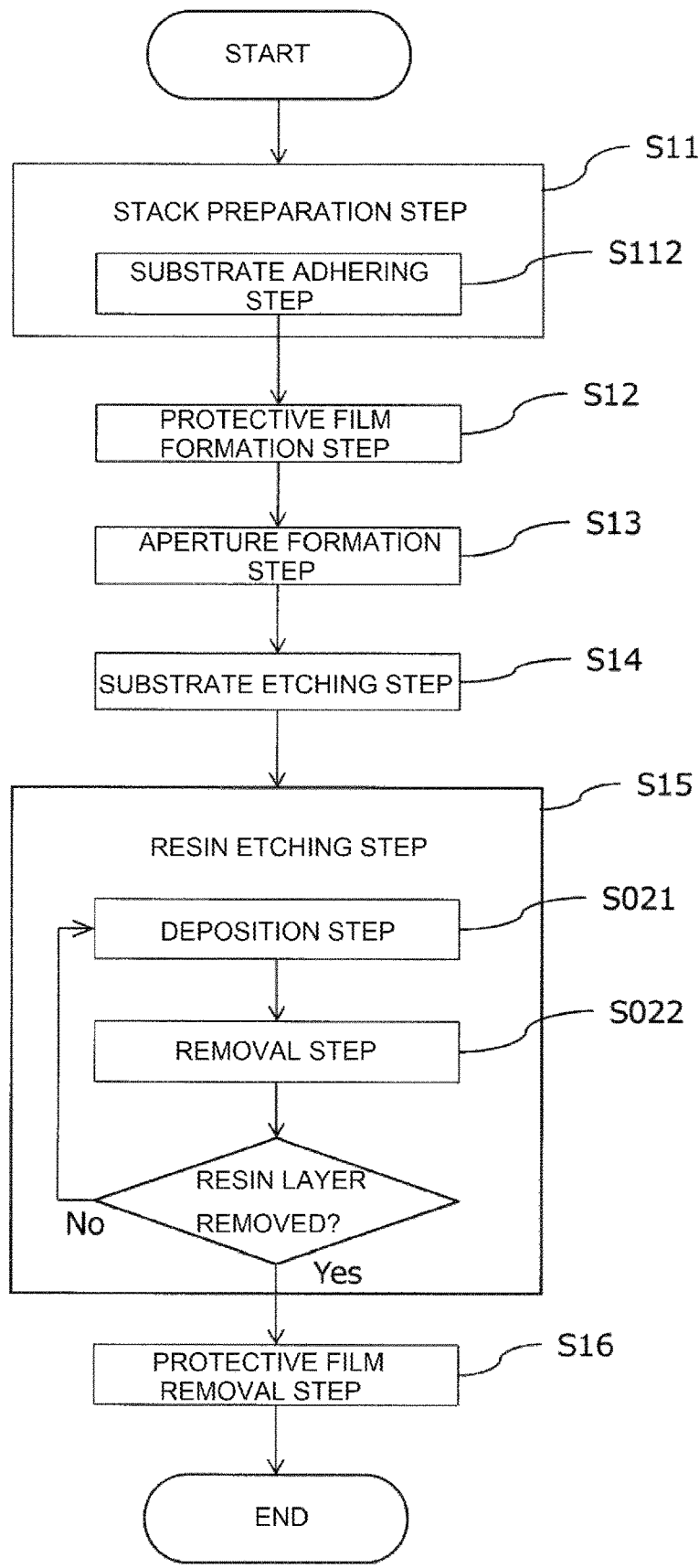
FIG. 20 is a flowchart of an element chip manufacturing method according to an embodiment II of the present invention.

In the embodiment II, the resin layer is an adhesive layer. The stack preparation step includes a step (S112) of adhering a substrate via an adhesion layer to a support member. The present embodiment is similar to the embodiment I, except the above. FIG. 20 is a flowchart of the manufacturing method according to the present embodiment.

In the step of adhering a substrate, an adhesive which is a material of the adhesion layer may be applied onto the support member at a predetermined position. The steps subsequent to the protective film formation step are performed similarly to in the embodiment I, except that the DAF is replaced with the adhesion layer. In view of the ease of handling, the steps subsequent to the protective film formation step, particularly, to the substrate etching step, may be performed while the stack is held by the conveying carrier.

Figure 21:
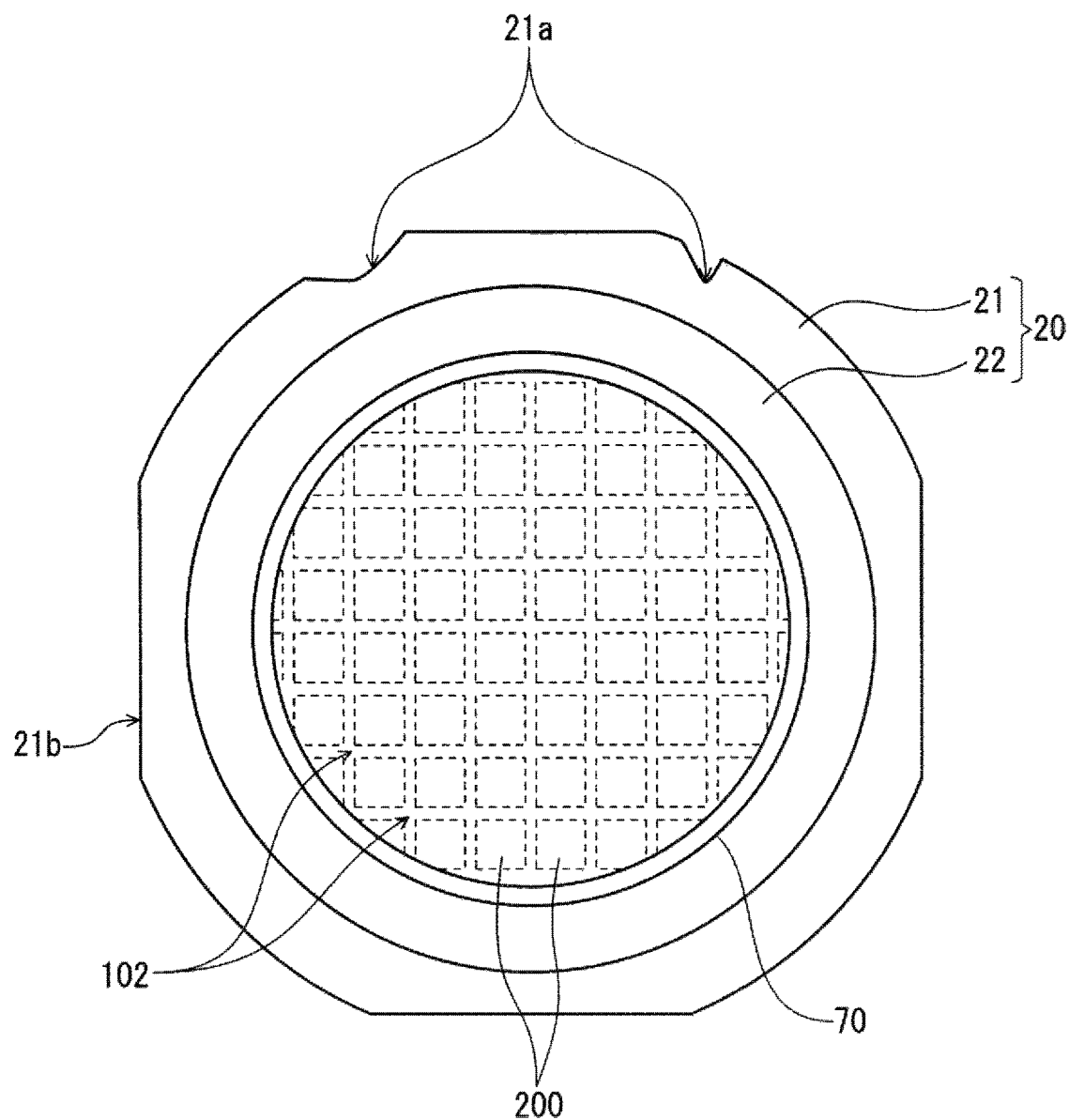
FIG. 21 is a schematic top view of a stack prepared in a preparation step according to the embodiment II of the present invention.
Figure 22:
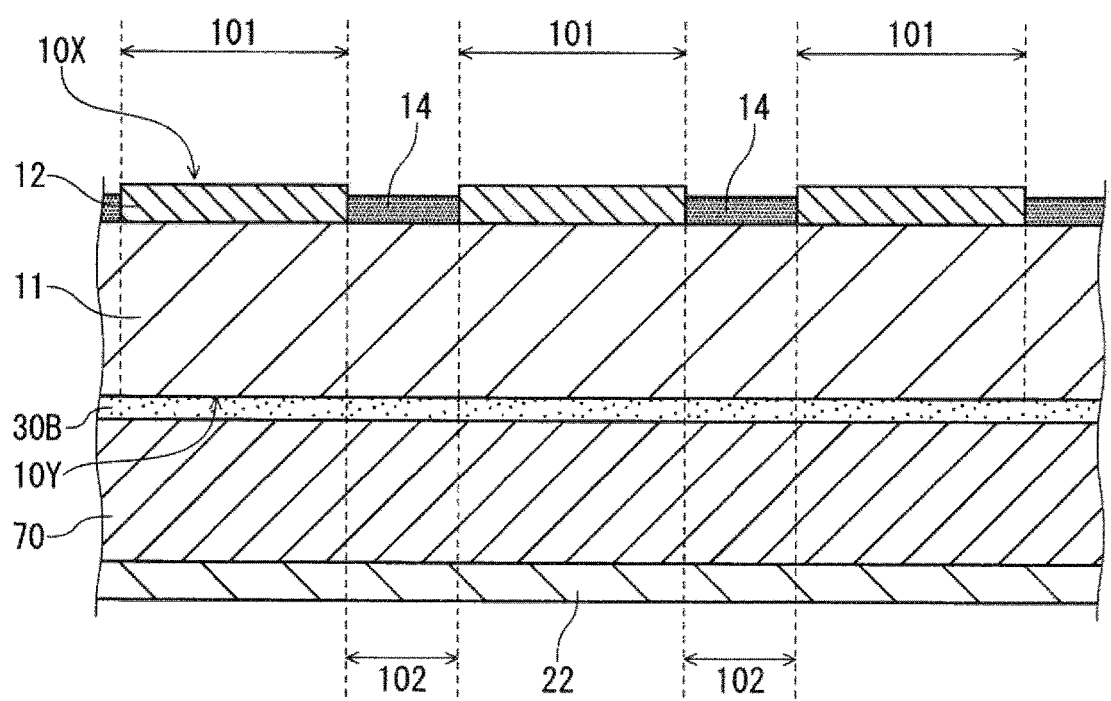
FIG. 22 is a schematic partial cross-sectional view of the stack prepared in a preparation step according to the embodiment II of the present invention.

FIG. 21 is a schematic top view of the stack prepared in the stack preparation step according to the present embodiment. FIG. 22 is a schematic partial cross-sectional view of the stack. The stack includes the substrate 10, a support member 70, and an adhesion layer (resin layer) 30B interposed therebetween. The stack is attached to the holding sheet 22 secured to the frame.

Figure 23:
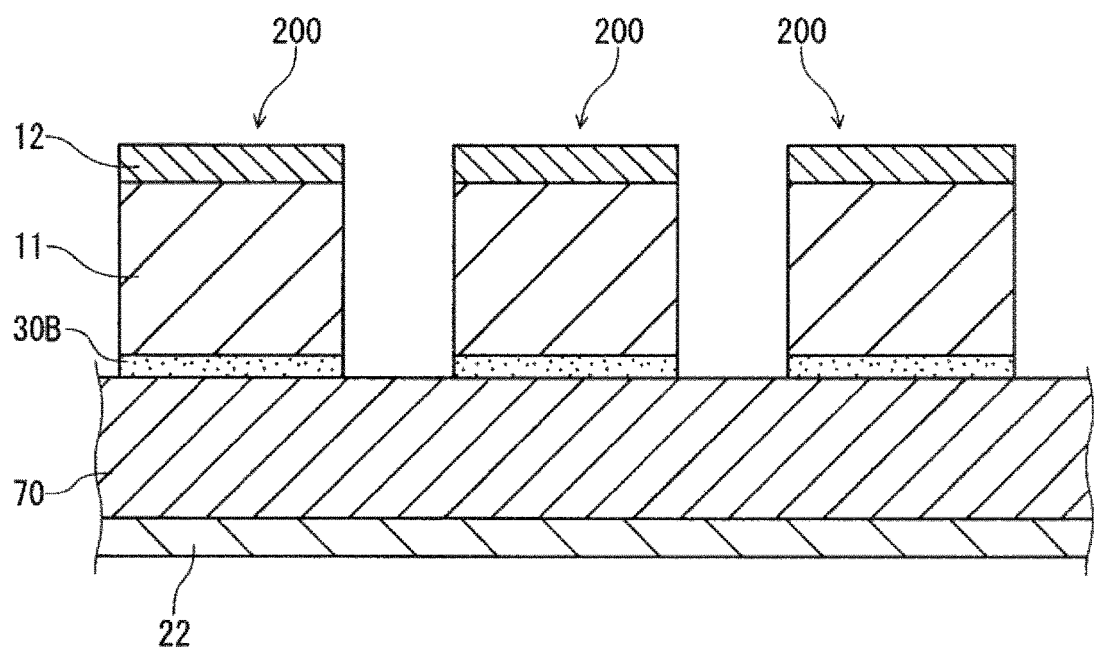
FIG. 23 is a schematic partial cross-sectional view of element chips after a protective film removal step according to the embodiment II of the present invention.

FIG. 23 is a schematic partial cross-sectional view of element chips after the protective film removal step according to the present embodiment. The adhesion layer 30B exposed from between the adjacent element chips is removed. The protective film 40 on the first surface 200X is also removed.

Figure 24:
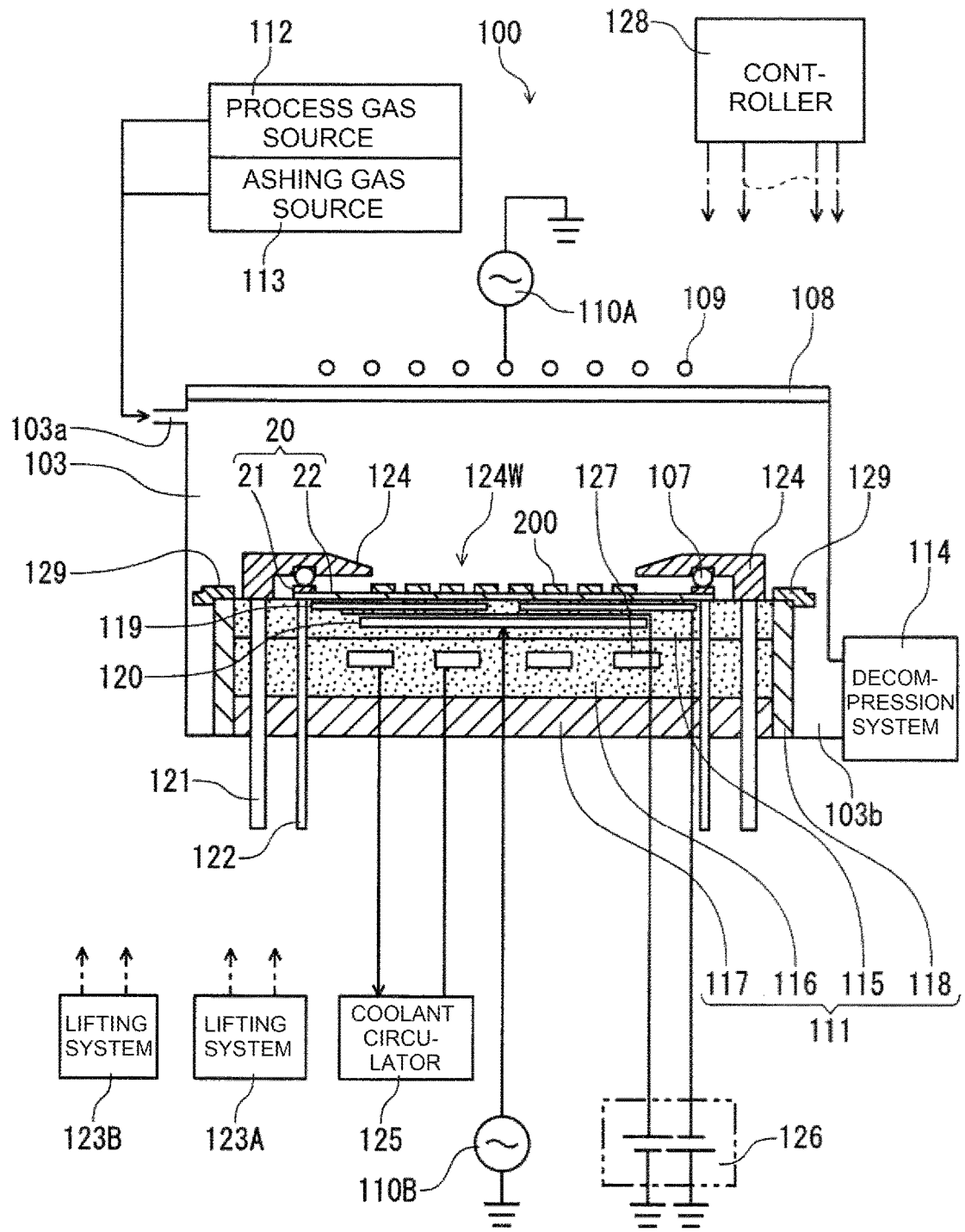
FIG. 24 is a schematic cross-sectional diagram of a plasma processing apparatus used in one embodiment of the present invention.

In the following, a plasma processing apparatus used for the substrate etching step and the resin etching step will be specifically described with reference to FIG. 24. The plasma processing apparatus, however, is not limited thereto. FIG. 24 is a schematic cross-sectional diagram of a plasma processing apparatus 100. In FIG. 24, a plurality of electronic components (element chips) are held by the conveying carrier.

(Plasma Processing Apparatus)

The plasma processing apparatus 100 includes a stage 111. The conveying carrier 20 holding the electronic components 200 is mounted on the stage 111, with the electronic component 200-holding surface of the holding sheet 22 faced upward. The stage 111 has such a size that the whole conveying carrier 20 can be placed thereon. Above the stage 111, a cover 124 having a window 124W for exposing at least one electronic component 200 therefrom is arranged. The cover 124 is provided with pressure members 107 for pushing the frame 21 downward while the frame 21 is placed on the stage 111. The pressure members 107 are preferably a member that can achieve point contact with the frame 21 (e.g., coil spring, elastic resin). This can correct a distortion of the frame 21, while restricting a thermal communication between the frame 21 and the cover 124.

The stage 111 and the cover 124 are arranged in a vacuum chamber 103. The vacuum chamber 103 is approximately cylindrical in shape, with the top open. The open top is closed by a dielectric member 108 serving as a lid. Examples of the constituent material of the vacuum chamber 103 include aluminum, stainless steel (SUS), and aluminum with anodic oxide coating. Examples of the constituent material of the dielectric member 108 include yttrium oxide ($Y_2O_3$), aluminum nitride (AlN), alumina ($Al_2O_3$), quartz ($SiO_2$), and other dielectric materials. Above the dielectric member 108, a first electrode 109 serving as an upper electrode is arranged. The first electrode 109 is electrically connected to a first high-frequency power source 110A. The stage 111 is arranged on the bottom side in the vacuum chamber 103. The stage 111 and the first electrode 109 are facing each other.

The vacuum chamber 103 is provided with a gas inlet 103a and a gas outlet 103b. The gas inlet 103a is connected to plasma-generating gas (process gas) supply sources, i.e., a process gas source 112 and an ashing gas source 113, each through a conduit. The gas outlet 103b is connected to a decompression system 114 including a vacuum pump for exhausting gas from the vacuum chamber 103 to reduce the pressure therein. While the vacuum chamber 103 is supplied with a process gas, a high-frequency power is supplied to the first electrode 109 from the first high-frequency power source 110A. A plasma is thus generated in the vacuum chamber 103.

The stage 111 incorporates a second electrode 120. Specifically, the stage 111 includes an electrode layer 115, a metal layer 116, and a base table 117 supporting the electrode layer 115 and the metal layer 116, each being approximately circular. The stage 111 further includes a peripheral member 118 surrounding the electrode layer 115, the metal layer 116, and the base table 117. Within the electrode layer 115, there disposed are an electrostatic chuck electrode (hereinafter, ESC electrode 119), and the second electrode 120 electrically connected to a second high-frequency power source 110B. The peripheral member 118 is formed of a metal having electrical conductivity and etching resistance, and serves to protect the electrode layer 115, the metal layer 116, and the base table 117 from plasma exposure. On the top surface of the peripheral member 118, an annular circumferential ring 129 is provided. The circumferential ring 129 serves to protect the top surface of the peripheral member 118 from plasma exposure. The electrode layer 115 and the circumferential ring 129 are formed of, for example, the dielectric material as mentioned above.

The ESC electrode 119 is electrically connected to a DC power source 126. An electrostatic chuck system is composed of the ESC electrode 119 and the DC power source 126. The electrostatic chuck system pulls the holding sheet 22 onto the stage 111 and secures it thereto. Although a description will be given below of a case where the electrostatic chuck system is used as a fixing system for fixing the holding sheet 22 to the stage 111, this should not be taken as a limitation. A clamp (not shown) may be used for fixing the holding sheet 22 to the stage 111.

The metal layer 116 is formed of, for example, aluminum with anodic oxidation coating. The metal layer 116 contains a coolant channel 127 configured to cool the stage 111. As the stage 111 is cooled down, the holding sheet 22 on the stage 111 is cooled down, and the cover 124 partially in contact with the stage 111 is also cooled down. This protects the electronic components 200 and the holding sheet 22 from damage due to heat during plasma processing. A coolant in the coolant channel 127 is circulated by a coolant circulator 125.

The stage 111 is provided near its periphery with a plurality of supports 122 penetrating through the stage 111. The supports 122 support the frame 21 of the conveying carrier 20. The supports 122 are driven to move up and down by a first lifting system 123A. The conveying carrier 20 delivered into the vacuum chamber 103 is passed onto the supports 122 that have been raised to a predetermined position. Then the supports 122 are lowered until their top surfaces become flush with or below the top surface of the stage 111. The conveying carrier 20 is thus placed at a predetermined position on the stage 111.

A plurality of lifting rods 121 are coupled to the cover 124 at its end, so that the cover 124 can be lifted and lowered. The lifting rods 121 are driven to move up and down by the second lifting system 123B. The lifting and lowering operation of the cover 124 by the second lifting system 123B can be controlled independently from the operation by the first lifting system 123A.

Figure 25:
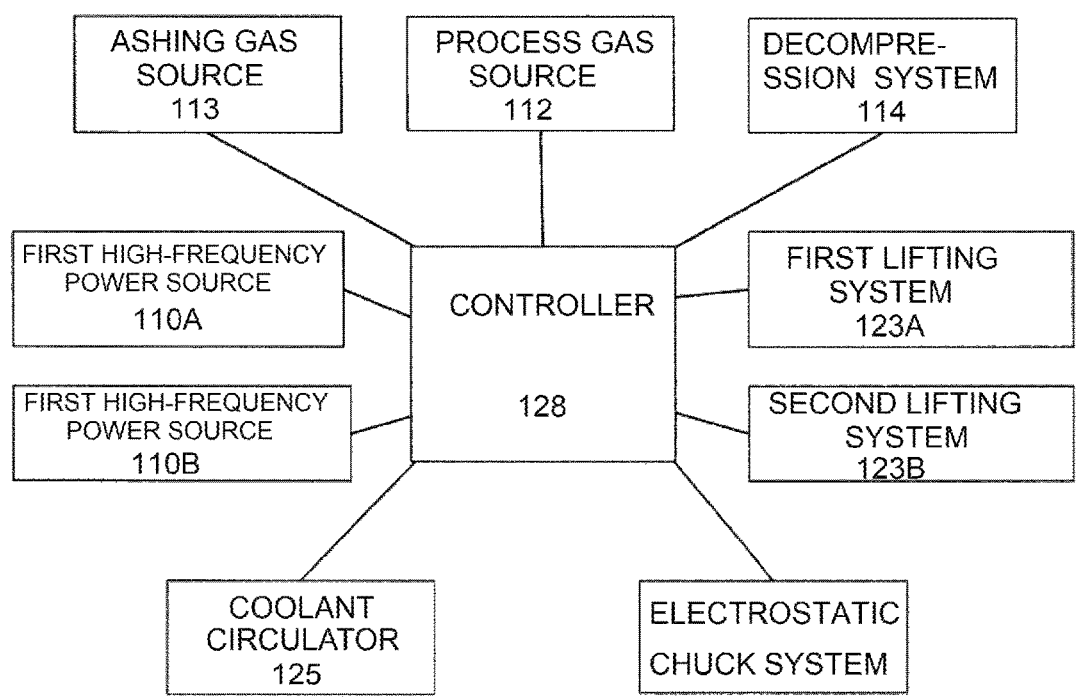
FIG. 25 a block diagram of the plasma processing apparatus used in one embodiment of the present invention.

A controller 128 controls the operations of constituent elements of the plasma processing apparatus 100, the elements including the first and second high-frequency power sources 110A and 110B, the process gas source 112, the ashing gas source 113, the decompression system 114, the coolant circulator 125, the first and second lifting systems 123A and 123B, and the electrostatic chuck system. FIG. 25 is a block diagram of the plasma processing apparatus used in the present embodiment.

The plasma processing is applied to the electronic components 200 after the conveying carrier 20 with the electronic components 200 held thereon is delivered into the vacuum chamber, and while the electronic components 200 are loaded on the stage 111.

Prior to the delivering of the conveying carrier 20, within the vacuum chamber 103, the cover 124 is lifted to a predetermined position by means of the lifting rods 121. A gate valve (not shown) opens, and the conveying carrier 20 is delivered into the chamber. A plurality of the supports 122 are on standby at a raised position. When the conveying carrier 20 reaches a predetermined position above the stage 111, the conveying carrier 20 is passed onto the supports 122. The conveying carrier 20 is passed onto the top surface of the supports 122, with the adhesive side of the holding sheet 22 faced upward.

After the conveying carrier 20 is passed onto the supports 122, the vacuum chamber 103 is hermetically closed. Next, the supports 122 start lowering. When the supports 122 are lowered until their top surfaces become flush with or below the top surface of the stage 111, the conveying carrier 20 is placed on the stage 111. Then, the lifting rods 121 is driven to lower the cover 124 to a predetermined position. At this time, the distance between the cover 124 and the stage 111 is adjusted such that the pressure members 107 provided in the cover 124 come in point-contact with the frame 21. In this way, the frame 21 is pushed downward by the pressure members 107, and simultaneously, the frame 21 is covered with the cover 124, and the substrate 10 is exposed from the window 124W.

The cover 124 has, for example, a doughnut-like shape with approximately circular contour, and has a predetermined width and a thin thickness. The diameter of the window 124W is smaller than the inner diameter of the frame 21, and the outer diameter thereof is greater than the outer diameter of the frame 21. Therefore, when the cover 124 is lowered while the conveying carrier 20 is mounted at a predetermined position on the stage 111, the cover 124 can cover the frame 21. From the window 124W, at least one electronic component 200 is exposed.

The cover 124 is formed of, for example, a dielectric, such as ceramics (e.g., alumina, aluminum nitride) or quarts, or a metal, such as aluminum or aluminum with an anodic oxidation coating. The pressure members 107 can be formed of the aforementioned dielectric or metal, or a resin material.

After the conveying carrier 20 is passed onto the supports 122, a voltage is applied to the ESC electrode 119 from the DC power source 126. This brings the holding sheet 22 into contact with the stage 111 as well as to be electrostatically adsorbed onto the stage 111. The voltage application to the ESC electrode 119 may be initiated after the holding sheet 22 is placed on (or in contact with) the stage 111.

Upon completion of the plasma processing, the gas in the vacuum chamber 103 is evacuated, and the gate valve opens. The conveying carrier 20 holding a plurality of the electronic components 200 is delivered out of the plasma processing apparatus 100 by means of a transfer system having entered through the gate valve. After the conveying carrier 20 is delivered out, the gate valve is immediately closed. The conveying carrier 20 may be delivered out by reversely performing the above-mentioned procedures of mounting the conveying carrier 20 on the stage 111. Specifically, after the cover 124 is lifted to a predetermined position, the voltage supply to the ESC electrode 119 is cut off to release the conveying carrier 20 from the stage 111, and then the supports 122 are raised. After the supports 122 reach a predetermined raised position, the conveying carrier 20 is delivered out.

According to the present invention, the resin layer can be removed, with the protective film allowed to continue to exist. The present invention is therefore useful as an etching method of various electronic components including the resin layer.

REFERENCE NUMERALS

200: electronic component (element chip)
  200X: first surface
  200Y: second surface
  200Z: sidewall
10: substrate
  10X: first surface
  10Y: second surface
  101: element region
  102: dicing region
11: semiconductor layer
12: wiring layer
14: insulating film
20: conveying carrier
  21: frame
    21a: notch
    21b: corner cut
  22: holding sheet
    22X: adhesive side
    22Y: non-adhesive side
30A: die attach film (DAF)
30B: resin layer
40: protective film
50: first film
70: support member
100: plasma processing apparatus
  103: vacuum chamber
    103a: gas inlet
    103b: gas outlet
  108: dielectric member
  109: first electrode
  110A: first high-frequency power source
  110B: second high-frequency power source
  111: stage
  112: process gas source
  113: ashing gas source
  114: decompression system
  115: electrode layer
  116: metal layer
  117: base table
  118: peripheral member
  119: ESC electrode
  120: second electrode
  121: lifting rod
  122: support
  123A: first lifting system
  123B: second lifting system
  124: cover
    124W: window
  125: coolant circulator
  126: DC power source
  127: coolant channel
  128: controller
  129: circumferential ring

What is claimed is:

1. An etching method, comprising:
a preparation step of preparing a resin layer and an electronic component supported by the resin layer; and
a resin etching step of etching the resin layer,
the electronic component having a first surface covered with a protective film, a second surface opposite to the first surface, and a sidewall between the first surface and the second surface, the second surface facing the resin layer,
the resin layer being larger than the electronic component when seen from the first surface side, the resin etching step including:
- a deposition step of depositing a first film, using a first plasma, on a surface of the protective film and a surface of the resin layer; and
- a removal step of removing, using a second plasma, the first film deposited on the resin layer and at least part of the resin layer,
- the deposition step and the removal step being alternately repeated a plurality of times, with the protective film allowed to continue to exist.

2. The etching method according to claim 1, wherein the resin etching step is performed so as to satisfy RR2/RR1>RD2/RD1, where
- RD2/RD1 is a ratio in the deposition step of a deposition rate RD2 of the first film on the surface of the resin layer to a deposition rate RD1 of the first film on the surface of the protective film, and
- RR2/RR1 is a ratio in the removal step of a removal rate RR2 of the first film from the resin layer to a removal rate RR1 of the first film from the protective film.

3. The etching method according to claim 2, wherein
- the resin etching step is performed in a plasma processing apparatus, the plasma processing apparatus including a chamber, a stage disposed in the chamber and loaded with the electronic component, and a second electrode incorporated in the stage; and
- the chamber is set at a pressure PD1 during the deposition step and at a pressure PR1 during the removal step, PD1 and PR1 satisfying PD1>PR1.

4. The etching method according to claim 2, wherein
- the resin etching step is performed in a plasma processing apparatus, the plasma processing apparatus including a stage loaded with the electronic component, a first electrode disposed so as to face the stage, and a second electrode incorporated in the stage; and
- a high-frequency power ED2 is applied to the second electrode during the deposition step, and a high-frequency power ER2 is applied to the second electrode during the removal step, ED2 and ER2 satisfying ED2<ER2.

5. The etching method according to claim 1, wherein
- a plurality of the electronic components are processed in the resin etching step, and
- a distance W between the sidewalls facing each other of any two of the electronic components and a height H of the sidewall of the one of the two of the electronic components satisfy H≥2 W.

6. The etching method according to claim 1, wherein the resin layer is a die attach film.

7. The etching method according to claim 1, wherein
- the resin layer is an adhesion layer, and
- the electronic component is supported together with the adhesion layer by a support member.

8. The etching method according to claim 1, wherein the first plasma is produced from a process gas containing carbon atoms.

9. The etching method according to claim 1, wherein the second plasma is produced from a process gas containing oxygen atoms.

10. An element chip manufacturing method, comprising:
- a preparation step of preparing a stack, the stack including a substrate having a first surface and a second surface opposite to the first surface, and a resin layer disposed facing the second surface, the substrate having a plurality of element regions and dicing regions defining the element regions;
- a protective film formation step of covering the first surface with a protective film;
- an aperture formation step of removing at least the protective film along the dicing regions, to form apertures;
- a substrate etching step of etching the substrate exposed from the apertures, from the first surface to the second surface; and
- a resin etching step of etching the resin layer exposed at a bottom of grooves formed by etching of the substrate, after the substrate etching step, the resin etching step including:
  - a deposition step of depositing a first film, using a first plasma, on a surface of the protective film and a surface of the resin layer; and
  - a removal step of removing, using a second plasma, the first film deposited on the resin layer and at least part of the resin layer,
  - the deposition step and the removal step being alternately repeated a plurality of times, with the protective film allowed to continue to exist.

11. The element chip manufacturing method according to claim 10, wherein
- the resin layer includes a die attach film, and
- the preparation step includes a step of attaching the substrate via the die attach film to a holding sheet secured to a frame.

12. The element chip manufacturing method according to claim 10, wherein
- the resin layer includes an adhesion layer, and
- the preparation step includes a step of adhering the substrate via the adhesion layer to a support member.

* * * * *